(12) United States Patent
Suk et al.

(10) Patent No.: US 11,348,876 B2
(45) Date of Patent: May 31, 2022

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Kyoung Lim Suk, Suwon-si (KR); Seung-Kwan Ryu, Seongnam-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/130,505

(22) Filed: Dec. 22, 2020

(65) Prior Publication Data

US 2021/0111128 A1 Apr. 15, 2021

Related U.S. Application Data

(63) Continuation of application No. 16/006,168, filed on Jun. 12, 2018, now Pat. No. 10,879,187.

(Continued)

(30) Foreign Application Priority Data

May 16, 2018 (KR) ........................ 10-2018-0056054

(51) Int. Cl.
*H01L 21/00* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01); *H01L 21/4864* (2013.01); *H01L 21/561* (2013.01); *H01L 21/565* (2013.01); *H01L 21/568* (2013.01); *H01L 21/6835* (2013.01);
(Continued)

(58) Field of Classification Search
None
See application file for complete search history.

(56) References Cited

U.S. PATENT DOCUMENTS

| 7,268,008 B2 | 9/2007 | Tomisaka et al. |
| 7,745,939 B2 | 6/2010 | Sunohara et al. |

(Continued)

FOREIGN PATENT DOCUMENTS

| JP | H0582581 | 4/1993 |
| JP | 4927357 | 5/2012 |
| JP | 2016058630 | 4/2016 |

*Primary Examiner* — Richard A Booth
(74) *Attorney, Agent, or Firm* — F. Chau & Associates, LLC

(57) ABSTRACT

A method of fabricating a semiconductor package includes forming a capping pattern on a chip pad of a semiconductor device. The semiconductor device includes a passivation pattern that exposes a portion of the chip pad, and the capping pattern covers the chip pad. The method further includes forming a redistribution layer on the capping pattern. Forming the redistribution layer includes forming a first insulation pattern on the capping pattern and the passivation pattern, forming a first opening in the first insulation pattern by performing exposure and development processes on the first insulation pattern, in which the first opening exposes a portion of the capping pattern, and forming a redistribution pattern in the first opening.

20 Claims, 39 Drawing Sheets

Related U.S. Application Data

(60) Provisional application No. 62/519,435, filed on Jun. 14, 2017.

(51) Int. Cl.
    *H01L 21/48*     (2006.01)
    *H01L 21/56*     (2006.01)
    *H01L 23/31*     (2006.01)
    *H01L 23/00*     (2006.01)
    *H01L 25/10*     (2006.01)
    *H01L 25/00*     (2006.01)
    *H01L 21/683*     (2006.01)
    *H01L 23/498*     (2006.01)

(52) U.S. Cl.
    CPC ...... *H01L 23/3114* (2013.01); *H01L 23/5383* (2013.01); *H01L 23/5386* (2013.01); *H01L 24/19* (2013.01); *H01L 24/20* (2013.01); *H01L 24/96* (2013.01); *H01L 25/105* (2013.01); *H01L 25/50* (2013.01); *H01L 23/3128* (2013.01); *H01L 23/49827* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/68359* (2013.01); *H01L 2224/0347* (2013.01); *H01L 2224/0392* (2013.01); *H01L 2224/03462* (2013.01); *H01L 2224/03831* (2013.01); *H01L 2224/03914* (2013.01); *H01L 2224/0401* (2013.01); *H01L 2224/04105* (2013.01); *H01L 2224/05027* (2013.01); *H01L 2224/05082* (2013.01); *H01L 2224/05147* (2013.01); *H01L 2224/05166* (2013.01); *H01L 2224/05558* (2013.01); *H01L 2224/05572* (2013.01); *H01L 2224/05647* (2013.01); *H01L 2224/12105* (2013.01); *H01L 2224/131* (2013.01); *H01L 2224/16238* (2013.01); *H01L 2224/214* (2013.01); *H01L 2224/32225* (2013.01); *H01L 2224/73204* (2013.01); *H01L 2224/81005* (2013.01); *H01L 2224/92125* (2013.01); *H01L 2224/94* (2013.01); *H01L 2225/1023* (2013.01); *H01L 2225/1035* (2013.01); *H01L 2225/1041* (2013.01); *H01L 2225/1058* (2013.01); *H01L 2924/1533* (2013.01); *H01L 2924/15174* (2013.01); *H01L 2924/15311* (2013.01)

(56) References Cited

U.S. PATENT DOCUMENTS

| | | |
|---|---|---|
| 8,049,343 B2 | 11/2011 | Nakatani |
| 9,117,799 B2 | 8/2015 | Akino |
| 9,230,929 B2 | 1/2016 | Daubenspeck et al. |
| 9,941,244 B2 | 4/2018 | Chang et al. |
| 10,879,187 B2 * | 12/2020 | Suk .................. H01L 21/4864 |
| 2018/0366411 A1 | 12/2018 | Suk et al. |

\* cited by examiner

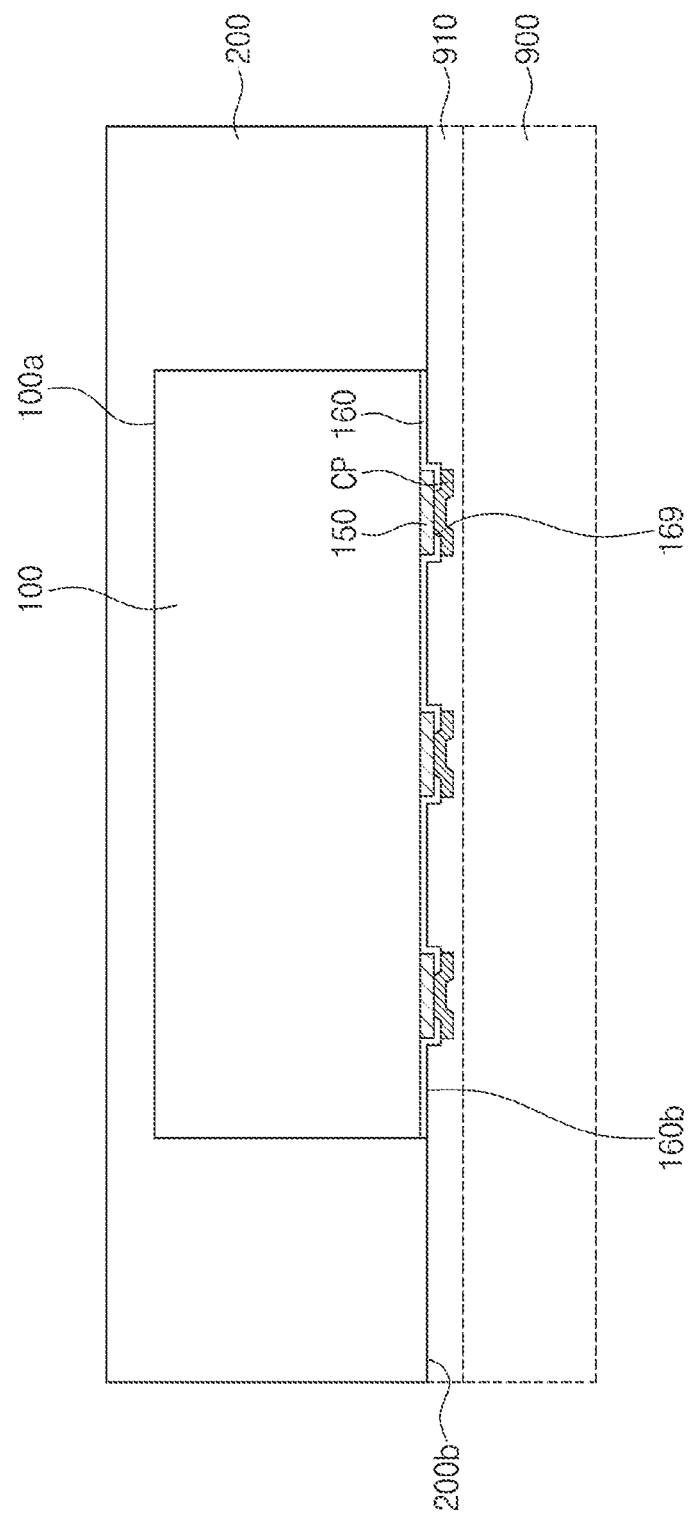

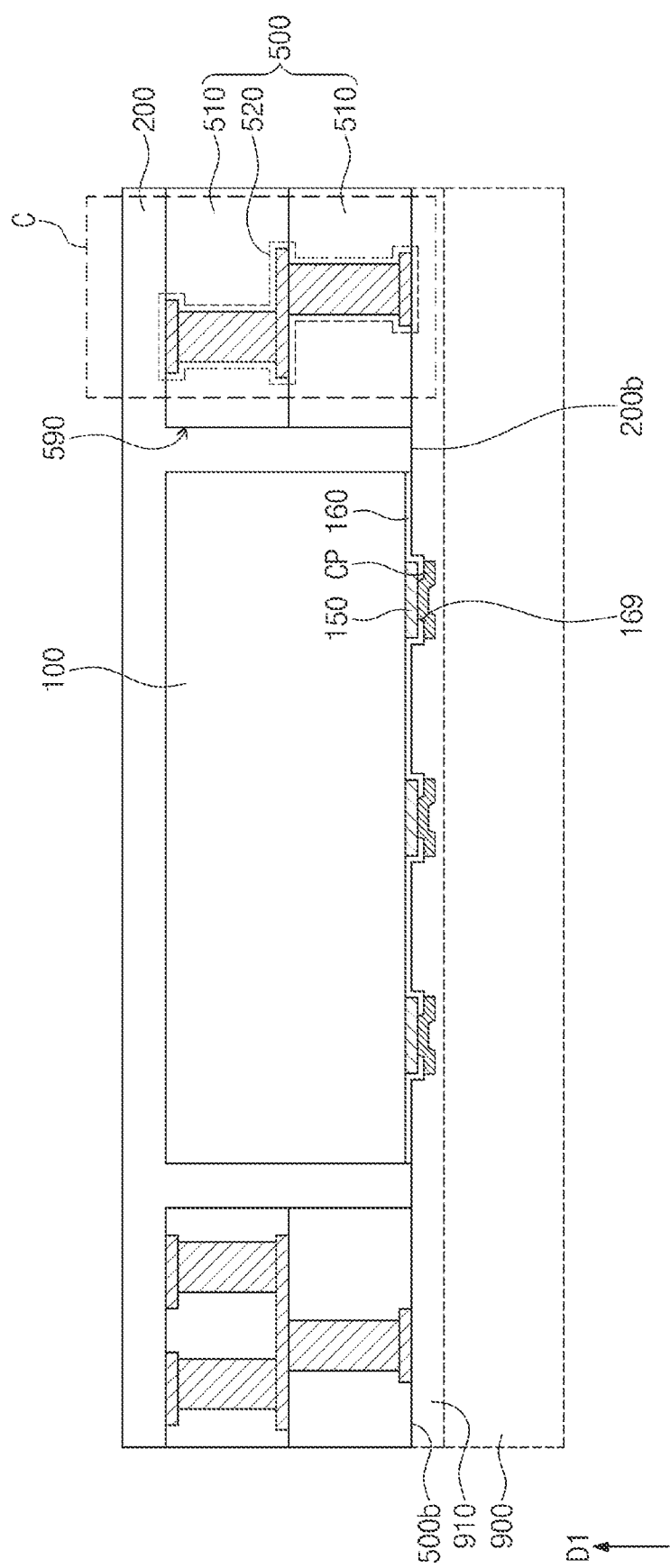

SEMICONDUCTOR PACKAGE AND METHOD OF FABRICATING THE SAME

CROSS-REFERENCE TO RELATED APPLICATIONS

This application is a continuation application of U.S. patent application Ser. No. 16/006,168 filed Jun. 12, 2018, which claims priority to and the benefit of Provisional Application Ser. No. 62/519,435 filed on Jun. 14, 2017, and priority under 35 U.S.C § 119 to Korean Patent Application No. 10-2018-0056054 filed on May 16, 2018, the disclosures of which are hereby incorporated by reference in their entireties.

TECHNICAL FIELD

Exemplary embodiments of the inventive concept relate to a semiconductor package and a method of fabricating the same, and more particularly, to a semiconductor package including a redistribution layer and a method of fabricating the same.

DISCUSSION OF THE RELATED ART

A semiconductor package is provided to implement an integrated circuit chip in electronic products. Typically, a semiconductor package is configured such that a semiconductor chip is mounted on a printed circuit board (PCB), and bonding wires or bumps are used to electrically connect the semiconductor chip to the printed circuit board. As advancements are made in the electronics industry, research is being performed to improve the reliability and durability of semiconductor packages.

SUMMARY

Exemplary embodiments of the inventive concept provide a semiconductor package having improved reliability and durability, and a method of fabricating the same.

According to exemplary embodiments of the inventive concept, a method of fabricating a semiconductor package includes forming a capping pattern on a chip pad of a semiconductor device. The semiconductor device includes a passivation pattern that exposes a portion of the chip pad, and the capping pattern covers the chip pad. The method further includes forming a redistribution layer on the capping pattern. Forming the redistribution layer includes forming a first insulation pattern on the capping pattern and the passivation pattern, forming a first opening in the first insulation pattern by performing exposure and development processes on the first insulation pattern, in which the first opening exposes a portion of the capping pattern, and forming a redistribution pattern in the first opening.

According to exemplary embodiments of the inventive concept, a method of fabricating a semiconductor package includes forming a chip pad on a semiconductor device, and forming a passivation pattern on the semiconductor device and the chip pad. The passivation pattern includes an opening that exposes a portion of the chip pad. The method further includes forming a capping pattern in the opening. The capping pattern covers the chip pad. The method further includes disposing the semiconductor device on a redistribution layer, and electrically connecting the chip pad to the redistribution layer by forming a connector between the capping pattern and the redistribution layer.

According to exemplary embodiments of the inventive concept, a semiconductor package includes a redistribution layer and a semiconductor device disposed on the redistribution layer. The semiconductor device includes a chip pad and a passivation pattern. The passivation pattern includes a pad opening that exposes a portion of the chip pad. The semiconductor package further includes a capping pattern disposed in the pad opening and covering the chip pad, and a molding pattern disposed on the redistribution layer and covering the semiconductor device. The redistribution layer includes a first insulation pattern in direct contact with the passivation pattern and extending onto a bottom surface of the molding pattern, and a redistribution pattern disposed on the first insulation pattern and electrically connected to the capping pattern.

According to exemplary embodiments of the inventive concept, a semiconductor package includes a redistribution layer and a semiconductor device disposed on the redistribution layer. The semiconductor device includes a chip pad and a passivation pattern. The passivation pattern includes a pad opening that exposes a portion of the chip pad. The semiconductor package further includes a capping pattern disposed in the pad opening and covering the chip pad, and a connector disposed between the redistribution layer and the capping pattern and coupled to the capping pattern.

According to exemplary embodiments of the inventive concept, a semiconductor package includes a redistribution layer and a semiconductor device disposed on the redistribution layer. The semiconductor device includes a chip pad and a passivation pattern. The passivation pattern includes a pad opening that exposes a portion of the chip pad. The semiconductor package further includes a capping pattern disposed in the pad opening and covering the chip pad, a first opening disposed in the redistribution layer that exposes a portion of the capping pattern, and a redistribution pattern disposed in the first opening and contacting the exposed portion of the capping pattern.

BRIEF DESCRIPTION OF THE DRAWINGS

The above and other features of the present inventive concept will become more apparent by describing in detail exemplary embodiments thereof with reference to the accompanying drawings, in which:

FIGS. 3A to 3E illustrate cross-sectional views showing a method of fabricating a semiconductor package according to exemplary embodiments of the inventive concept.

FIGS. 9A and 9C illustrate cross-sectional views showing a method of fabricating a semiconductor package according to exemplary embodiments of the inventive concept.

DETAILED DESCRIPTION OF THE EXEMPLARY EMBODIMENTS

Figure 1A:
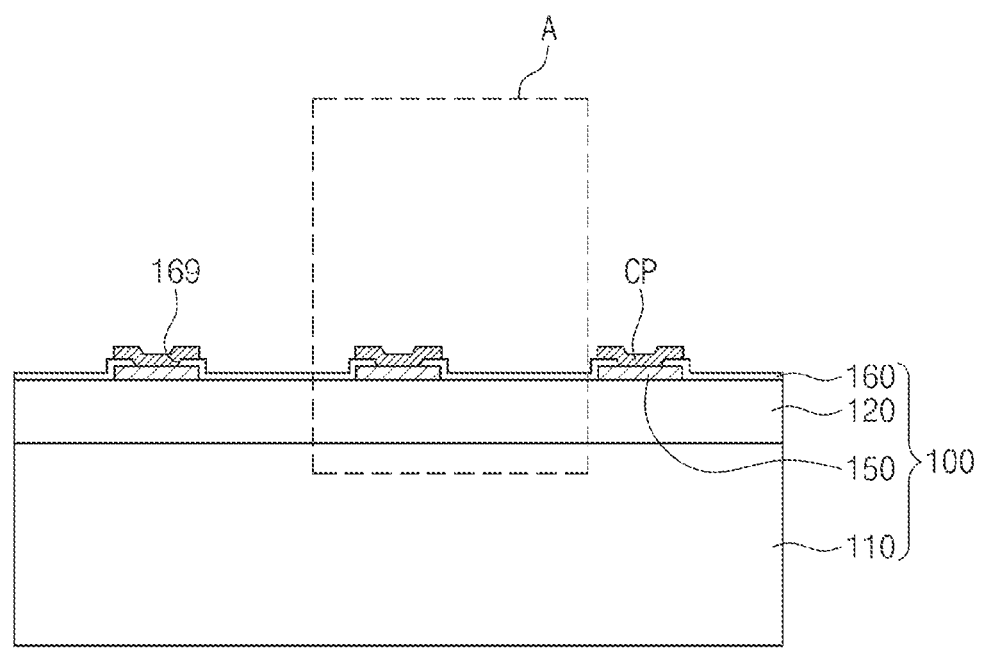
FIG. 1A illustrates a cross-sectional view showing a semiconductor device according to exemplary embodiments of the inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present (unless the context clearly indicates otherwise). It will also be understood that when a component is referred to as being "between" two components, it can be the only component between the two components, or one or more intervening components may also be present (unless the context clearly indicates otherwise). It will also be understood that when a component is referred to as "covering" another component, it can be the only component covering the other component, or one or more intervening components may also be covering the other component (unless the context clearly indicates otherwise).

Figure 1B:
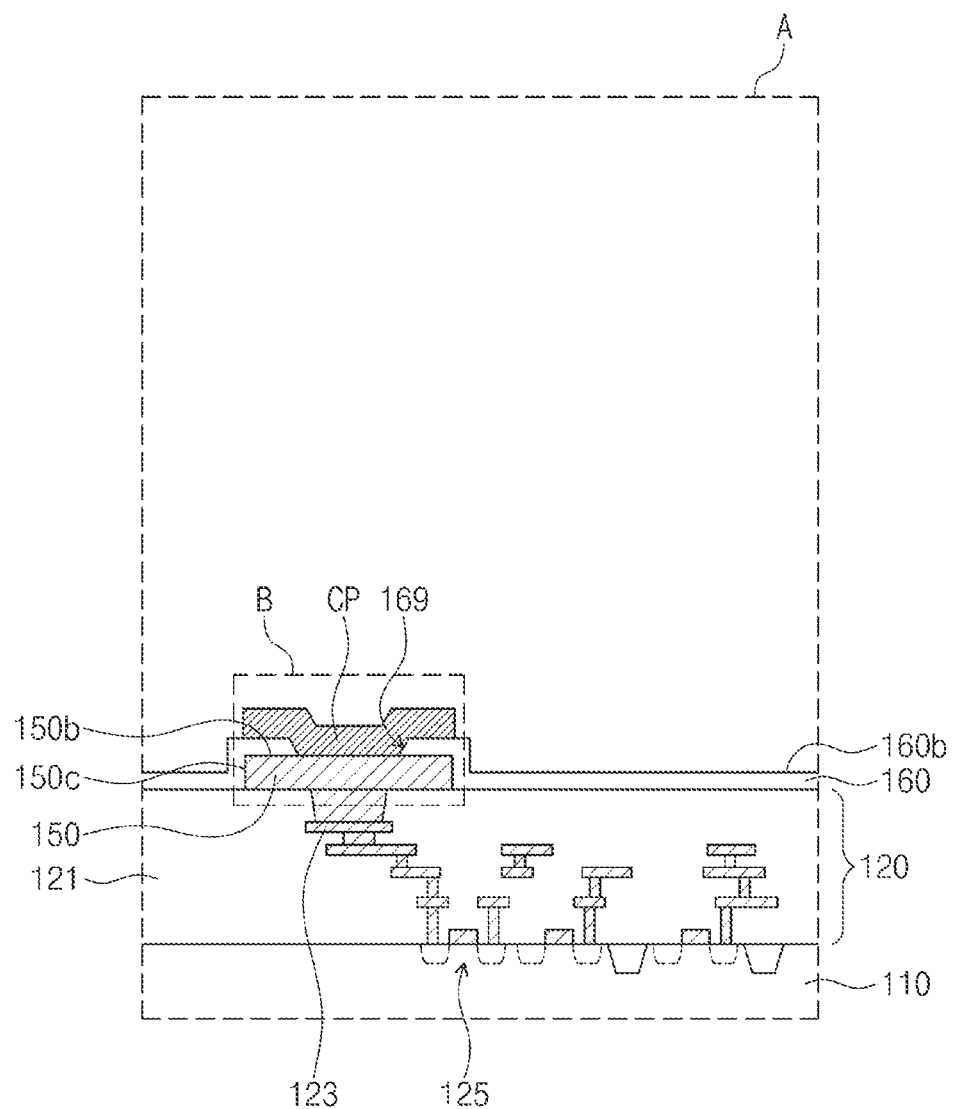
FIG. 1B illustrates an enlarged view showing section A of FIG. 1A according to exemplary embodiments of the inventive concept.
Figure 1C:
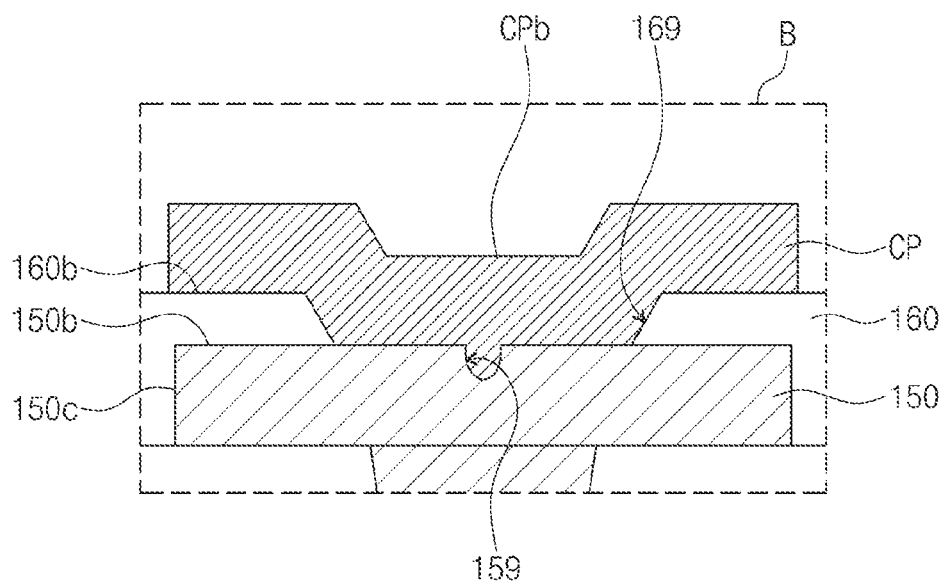
FIG. 1C illustrates an enlarged view showing section B of FIG. 1B according to exemplary embodiments of the inventive concept.

FIG. 1A illustrates a cross-sectional view showing a semiconductor device according to exemplary embodiments of the inventive concept. FIG. 1B illustrates an enlarged view showing section A of FIG. 1A according to exemplary embodiments of the inventive concept. FIG. 1C illustrates an enlarged view showing section B of FIG. 1B according to exemplary embodiments of the inventive concept.

Referring to FIGS. 1A, 1B, and 1C, in an exemplary embodiment, a semiconductor device 100 includes a semiconductor substrate 110, a circuit layer 120, a passivation pattern 160, and a chip pad 150. The semiconductor device 100 may be, for example, a semiconductor chip including a memory chip, a logic chip, or any combination thereof. The semiconductor substrate 110 may include a semiconductor material such as, for example, silicon, germanium, or silicon-germanium. The circuit layer 120 is disposed on one surface of the semiconductor substrate 110. As illustrated in FIG. 1B, the circuit layer 120 may include an insulation layer 121, integrated devices 125 (also referred to as integrated circuits 125), and internal lines 123. The integrated devices 125 are disposed on the one surface of the semiconductor substrate 110. The integrated devices 125 may include, for example, transistors. The insulation layer 121 is disposed on the one surface of the semiconductor substrate 110, and covers the integrated devices 125. The insulation layer 121 may include a plurality of layers. The internal lines 123 are disposed in the insulation layer 121. The internal lines 123 are electrically connected to the integrated devices 125. Herein, when components are referred to as being electrically connected/coupled to each other, the components may be directly connected/coupled to each other, or may be indirectly connected/coupled to each other through another conductive component. Further, when a component is described as being electrically connected to the semiconductor device 100, the component may be electrically connected to the integrated devices 125 of the semiconductor device 100.

The chip pad 150 is disposed on the circuit layer 120. The chip pad 150 may include metal such as, for example, aluminum. One or more chip pads 150 may be electrically connected to the integrated devices 125 through the internal lines 123.

The passivation pattern 160 is disposed on the circuit layer 120. The passivation pattern 160 includes a pad opening 169 that exposes a surface 150b of the chip pad 150. The surface 150b of the chip pad 150 stands opposite to the semiconductor substrate 110 (e.g., the surface 150b of the chip pad 150 does not face the semiconductor substrate 110). The passivation pattern 160 extends onto and covers an edge of the chip pad 150. The passivation pattern 160 covers a sidewall 150c of the chip pad 150 and a portion of the surface 150b of the chip pad 150. The portion of the surface 150b of the chip pad 150 that is covered by the passivation pattern 160 is adjacent to the sidewall 150c of the chip pad 150. The passivation pattern 160 may include a silicon-containing insulating material such as, for example, silicon oxide, silicon nitride, silicon oxynitride, and/or tetraethyl orthosilicate (TEOS). The passivation pattern 160 may be a multi-layer pattern.

A capping pattern CP is disposed in the pad opening 169 and covers the chip pad 150. In an exemplary embodiment, the capping pattern CP completely covers the portion of the chip pad 150 that is exposed through the pad opening 169. In an exemplary embodiment, the capping pattern CP completely covers the chip pad 150. For example, in an exemplary embodiment, the capping pattern CP completely covers the exposed portion of the chip pad 150 that is exposed through the pad opening 169, and further covers the remaining portion of the chip pad 150 that is not exposed through the pad opening 169 (e.g., with the passivation pattern 160 disposed therebetween). The capping pattern CP further extends onto a sidewall of the pad opening 169 and onto a surface 160b of the passivation pattern 160. In an exemplary embodiment, the capping pattern CP fully fills the pad opening 169. For example, as illustrated in FIG. 1C, in an exemplary embodiment, the capping pattern CP formed in the pad opening 169 includes a surface CPb that is disposed at a higher level than the surface 160b of the passivation pattern 160. The surface CPb of the capping pattern CP and the surface 160b of the passivation pattern 160 stand opposite to the semiconductor substrate 110 (e.g., the surface CPb of the capping pattern CP and the surface 160b of the passivation pattern 160 do not face the semiconductor substrate 110). Alternatively, in an exemplary embodiment, the capping pattern CP partially fills the pad opening 169. The capping pattern CP may include metal such as, for example, copper. The capping pattern CP protects the chip pad 150 from reactive materials including, for example, chlorine ions.

Referring to FIG. 1C, in an exemplary embodiment, a recess 159 is disposed on the surface 150b of the chip pad 150 in an area that is exposed through the pad opening 169. The capping pattern CP is disposed on the surface 150b of the chip pad 150, and fills the recess 159. Alternatively, in an exemplary embodiment, the recess 159 is not included. For convenience of illustration, the insulation layer 121, the integrated devices 125, and the internal lines 123 are only shown in FIGS. 1A and 1B, and are omitted in the other figures.

FIGS. 2A to 2G illustrate enlarged cross-sectional views of section A of FIG. 1A, and illustrate a method of fabricating a semiconductor device according to exemplary embodiments of the inventive concept. For convenience of explanation, a further description of elements and processes previously described may be omitted below. The method of fabricating a semiconductor device according to exemplary embodiments will be described with reference to FIG. 1A and FIGS. 2A to 2G.

Figure 2A:
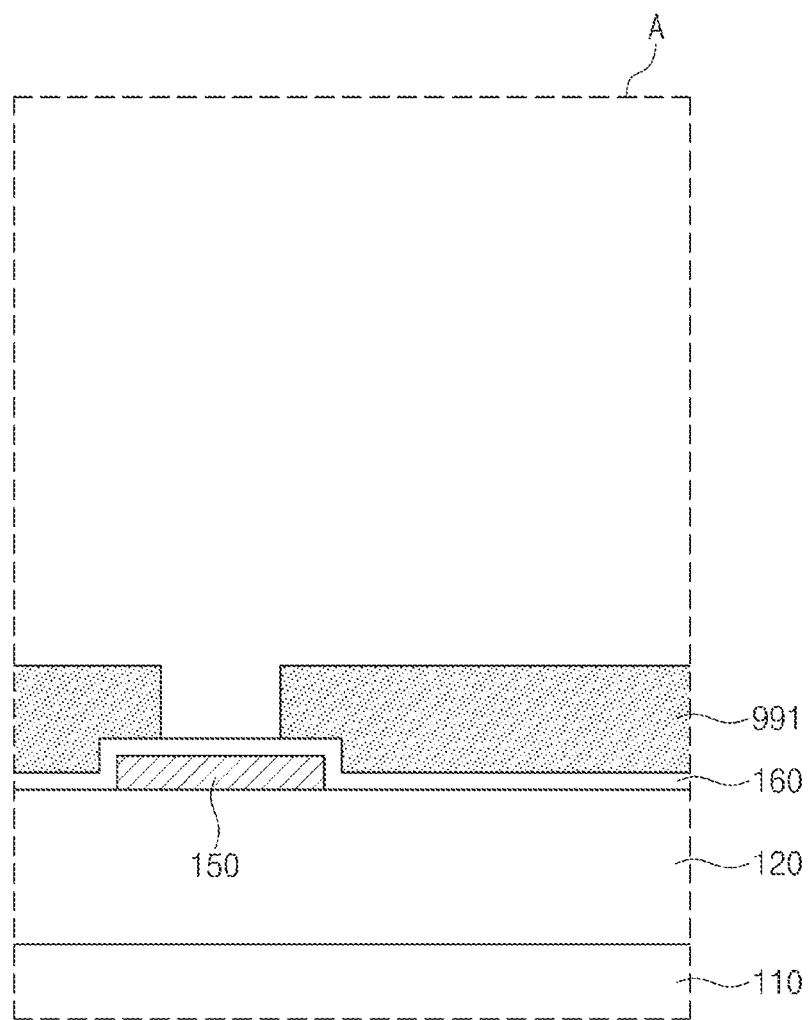
FIGS. 2A to 2G illustrate cross-sectional views showing a method of fabricating a semiconductor device according to exemplary embodiments of the inventive concept.

Referring to FIG. 2A, a semiconductor device 100 including a semiconductor substrate 110, a circuit layer 120, and a chip pad 150 is prepared. The semiconductor substrate 110 may be, for example, a wafer-level or chip-level substrate. The chip pad 150 may be formed by, for example, an electroless plating process. A passivation pattern 160 is formed on the circuit layer 120 and covers the chip pad 150. The passivation pattern 160 may be formed by a deposition process such as, for example, plasma vapor deposition or high density plasma chemical vapor deposition.

A first resist layer 991 is formed on the passivation pattern 160. The first resist layer 991 partially exposes the passivation pattern 160. The formation of the first resist layer 991 may include, for example, forming a coating layer of a photoresist material and patterning the coating layer. The patterning of the coating layer may be performed by, for example, exposure and development processes.

Figure 2B:
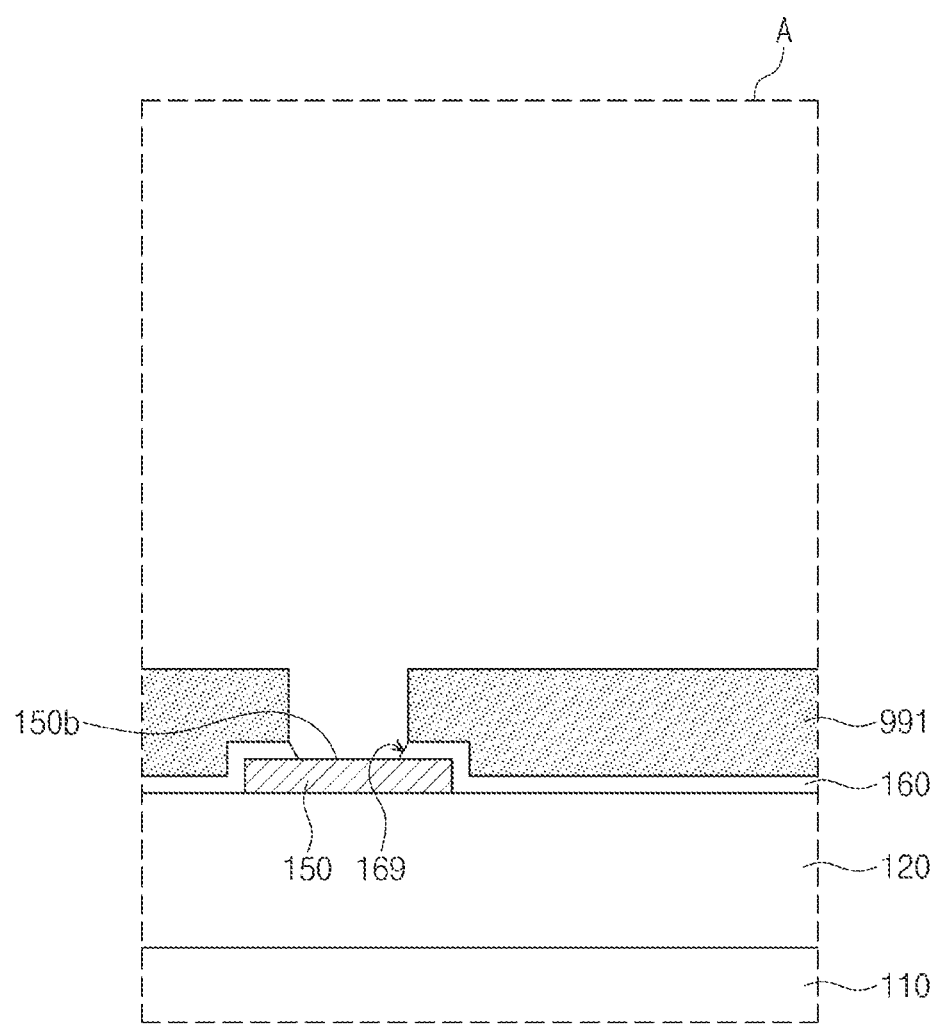

Referring to FIG. 2B, a pad opening 169 is formed in the passivation pattern 160 and exposes the chip pad 150. An etching process using the first resist layer 991 as an etching mask may be performed on the passivation pattern 160 to form the pad opening 169. The etching process may be, for example, a dry etching process or a wet etching process. In an exemplary embodiment, the pad opening 169 has a diameter less than that of the chip pad 150. In an exemplary embodiment, a width of the pad opening 169 in a cross-sectional view is less than that of the chip pad 150. The pad opening 169 partially exposes the surface 150b of the chip pad 150, and an edge of the chip pad 150 is covered by the passivation pattern 160. Thereafter, the first resist layer 991 is removed.

Figure 2C:
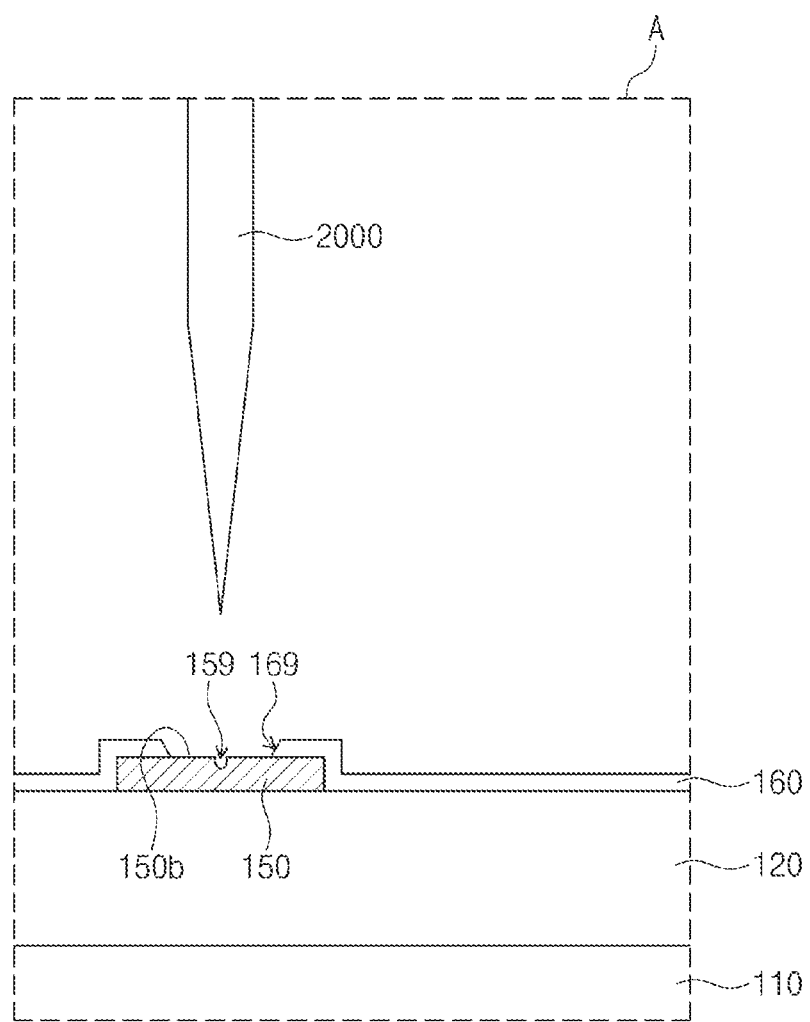

Referring to FIG. 2C, the semiconductor device 100 may be inspected for electrical characteristics. The electrical inspection may be, for example, an electrical die sorting (EDS) test. For example, the chip pad 150 may be contacted with a probe 2000 to inspect electrical connections and characteristics between the chip pad 150 and the integrated circuits 125 (see FIG. 1B). After the probe 2000 contacts the chip pad 150, in an exemplary embodiment, a recess 159 is formed on the surface 150b of the chip pad 150 due to contacting with the probe 2000. The recess 159 is described above with reference to FIG. 1C. For convenience of illustration, the recess 159 is shown in FIGS. 1C and 2C, and is omitted in the other figures.

Impurities may remain on the surface 150b of the chip pad 150. The impurities may include, for example, compounds produced in processes or residues of the first resist layer 991 shown in FIGS. 2A and 2B. Cleaning and heat treatment processes may be performed on the chip pad 150 to remove the impurities. When the heat treatment process is performed at a temperature less than about 100° C., it may be difficult to remove the impurities or the solution used in the cleaning process. Thus, in exemplary embodiments, the heat treatment process may be performed at a temperature ranging from about 100° C. to about 150° C. A solution used in the cleaning process may further be removed during the heat treatment process.

Figure 2D:
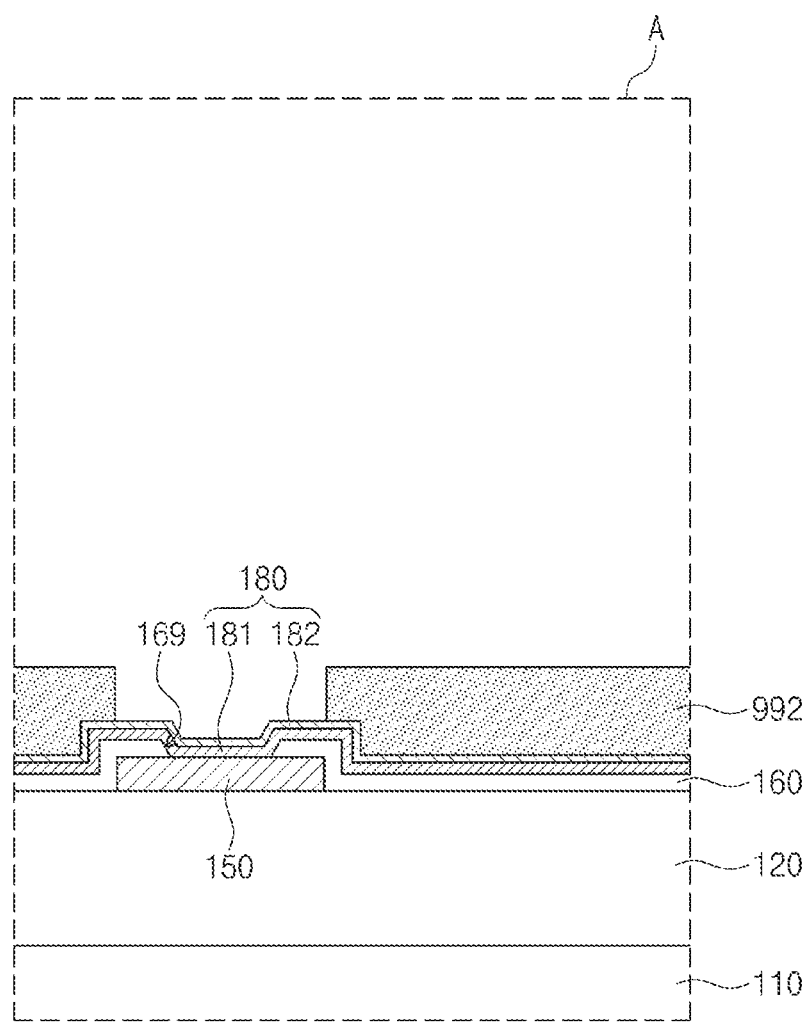

Referring to FIG. 2D, a seed layer 180 is conformally formed on the passivation pattern 160 and in the pad opening 169. The seed layer 180 covers the chip pad 150 exposed through the pad opening 169 and covers a sidewall of the passivation pattern 160 exposed through the pad opening 169. The seed layer 180 may include a first seed layer 181 and a second seed layer 182 stacked on the first seed layer 181. The first seed layer 181 may include, for example, titanium or titanium tungsten (TiW), and the second seed layer 182 may include, for example, copper. A deposition process may be used to form the first and second seed layers 181 and 182.

A second resist layer 992 is formed on the seed layer 180. The second resist layer 992 partially exposes the seed layer 180. For example, the second resist layer 992 may expose the seed layer 180 in an area in which the seed layer 180 is disposed over the chip pad 150. The formation of the second resist layer 992 may include, for example, forming a coating layer of a photoresist material and patterning the coating layer. The patterning of the coating layer may be performed, for example, by exposure and development processes. When the second resist layer 992 is patterned, an unwanted residue of the second resist layer 992 may remain on the chip pad 150 and/or in the pad opening 169. A removal process may further be performed to remove this unwanted residue from the chip pad 150 and/or the pad opening 169.

Figure 2E:
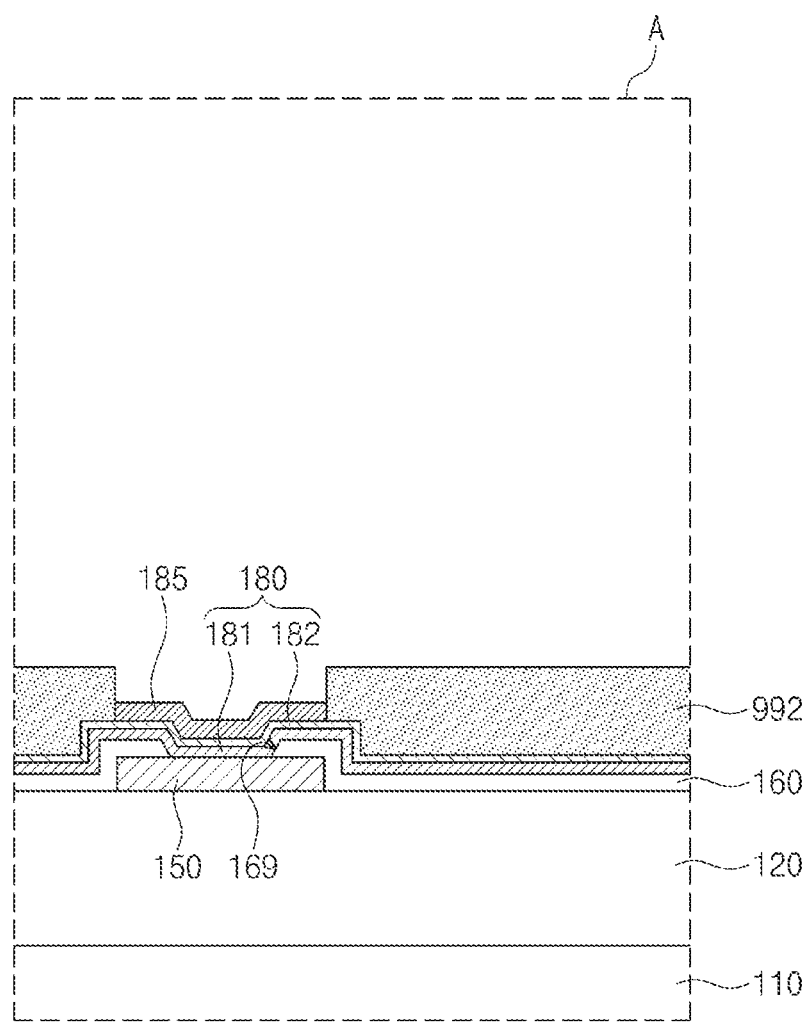

Referring to FIG. 2E, a conductive pattern 185 is formed by, for example, an electroplating process in which the seed layer 180 is used as an electrode. The conductive pattern 185 is selectively formed on a portion of the seed layer 180 that is exposed by the second resist layer 992. The conductive pattern 185 fills the pad opening 169. In exemplary embodiments, the conductive pattern 185 includes the same material as that of the second seed layer 182. For example, in an exemplary embodiment in which the second seed layer 182 includes copper, the conductive pattern 185 includes copper.

Figure 2F:
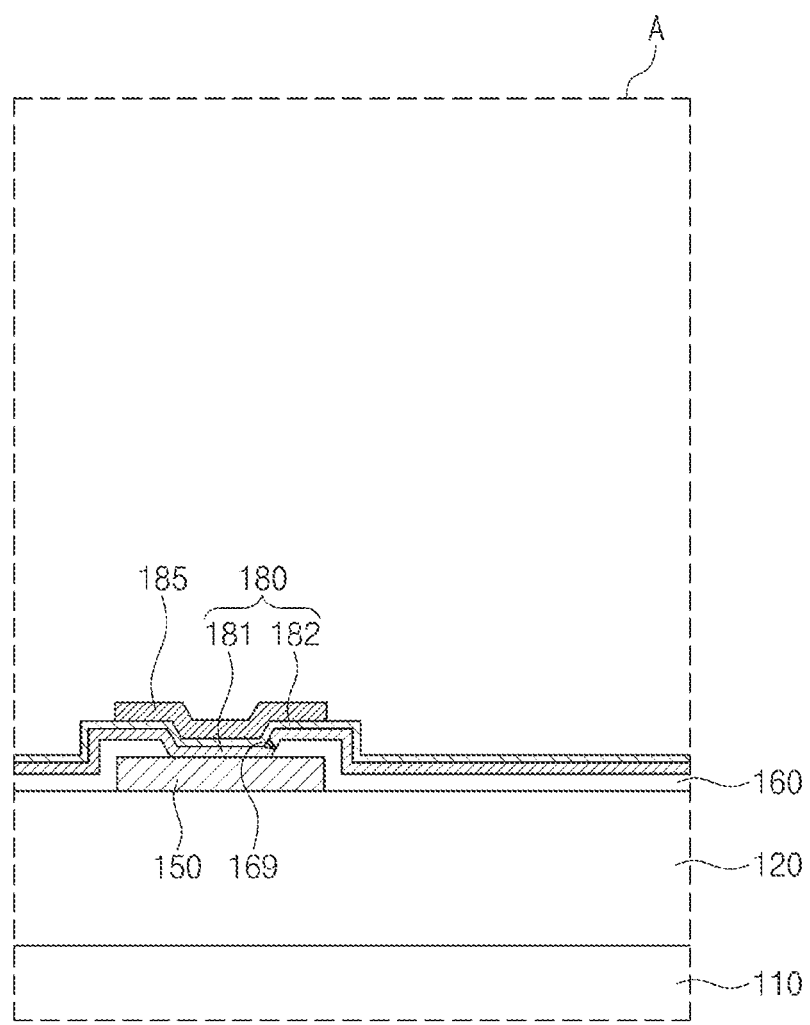

Referring to FIG. 2F, the second resist layer 992 is removed to expose the seed layer 180.

Figure 2G:
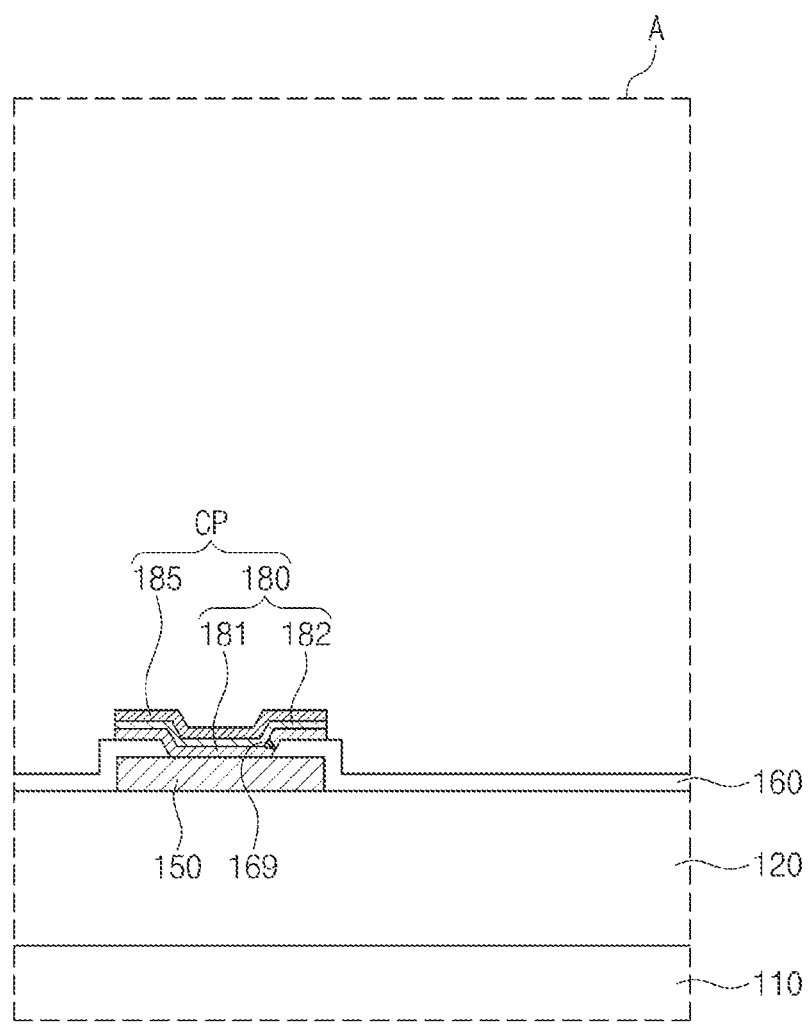

Referring to FIG. 2G, an etching process is performed to remove the portion of the seed layer 180 that is not covered by the conductive pattern 185 to form the capping pattern CP. In exemplary embodiments, a first etching process may be performed to remove the second seed layer 182 and to expose the first seed layer 181. The first etching process may be, for example, a wet etching process. The conductive pattern 185 may be partially removed together with the second seed layer 182 during the first etching process. The conductive pattern 185 may have a thickness greater than that of the second seed layer 182. After the first etching process, the conductive pattern 185 may remain and the second seed layer 182 may also remain on a bottom surface of the conductive pattern 185. A second etching process may then be performed to remove the portion of the first seed layer 181 that is not covered by the conductive pattern 185 and to expose the passivation pattern 160. When the second etching process is performed, the first seed layer 181 has an etch selectivity with respect to the conductive pattern 185. Therefore, after the second etching process, the conductive pattern 185 and the first seed layer 181 on the bottom surface of the conductive pattern 185 are not removed. The capping pattern CP includes the seed layer 180 and the conductive pattern 185 stacked on the seed layer 180.

In exemplary embodiments, a contact resistance is improved between the chip pad 150 and the capping pattern CP because the impurities and unwanted residue are removed, as described above with reference to FIGS. 2C and 2D. Through the above-described processes, the semiconductor device 100 shown in FIGS. 1A to 1C is fabricated. The semiconductor device 100 may be fabricated at a wafer level.

For convenience of illustration, the seed layer 180 and the conductive pattern 185 are shown in FIGS. 2D, 2E, 2F, and 2G, and are omitted from the other figures. In addition, for convenience of illustration, the semiconductor substrate 110 and the circuit layer 120 are omitted in FIGS. 3A to 11B described below.

A semiconductor package and a method of fabricating the semiconductor package according to exemplary embodiments of the inventive concept will be described hereinafter.

FIGS. 3A to 3E illustrate cross-sectional views showing a method of fabricating a semiconductor package according to exemplary embodiments of the inventive concept. FIG. 3F illustrates an enlarged view showing section A' of FIG. 3E according to exemplary embodiments of the inventive concept. For convenience of explanation, a further description of elements and processes previously described may be omitted below. In the following description with reference to FIGS. 3A to 11B, FIG. 3E is used as a reference when referring to a top surface, a bottom surface, an upper portion, and a lower portion.

Referring to FIG. 3A, a semiconductor device 100 and a molding pattern 200 are disposed on a carrier substrate 900. A carrier adhesive layer 910 is interposed between the carrier substrate 900 and the semiconductor device 100, and between the carrier substrate 900 and the molding pattern 200. The semiconductor device 100 includes the capping pattern CP described above. The semiconductor device 100 may be the semiconductor device 100 described with reference to FIGS. 1A to 1C, and fabricated as described with reference to FIGS. 2A to 2G. The molding pattern 200 is formed on the carrier substrate 900 and covers at least a portion of the semiconductor device 100. For example, in an exemplary embodiment, the molding pattern 200 covers a top surface 100a and a side surface of the semiconductor device 100. In an exemplary embodiment, the molding pattern 200 covers the side surface of the semiconductor device 100, and exposes the top surface 100a of the semiconductor device 100. In an exemplary embodiment, the molding pattern 200 contacts and covers an entirety of the semiconductor device 100 except for the portion of the semiconductor device 100 that contacts the carrier substrate 900 and/or the carrier adhesive layer 910. The molding pattern 200 may include an insulating resin such as, for example, an epoxy molding compound (EMC). The molding pattern 200 may further include a filler dispersed in the insulating resin. The filler may include, for example, silicon oxide (SiO2). The molding pattern 200 has a bottom surface 200b that is disposed at substantially the same level as the surface 160b of the passivation pattern 160. The carrier adhesive layer 910 and the carrier substrate 900 are removed to expose the capping pattern CP, a bottom surface of the semiconductor device 100, and the bottom surface 200b of the molding pattern 200. The bottom surface of the semiconductor device 100 may correspond to the surface 160b of the passivation pattern 160 and a bottom surface of the capping pattern CP.

Figure 3B:
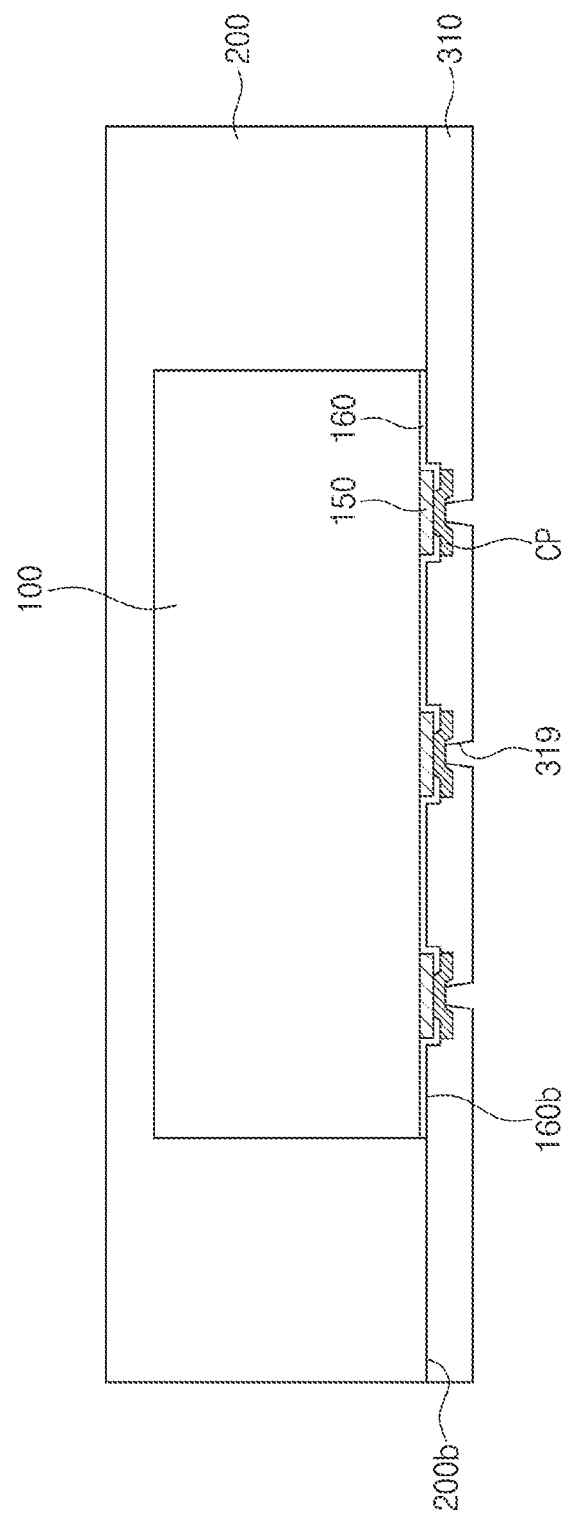

Referring to FIG. 3B, a first insulation pattern 310 is formed on the bottom surface of the semiconductor device 100 and the bottom surface 200b of the molding pattern 200. The first insulation pattern 310 may be formed, for example, by a deposition or coating process. In an exemplary embodiment, the first insulation pattern 310 is in direct contact with the surface 160b of the passivation pattern 160, the capping pattern CP, and the bottom surface 200b of the molding pattern 200. In an exemplary embodiment, the chip pad 150 is not in contact with the first insulation pattern 310, and is spaced apart from the first insulation pattern 310 by the capping pattern CP. The first insulation pattern 310 may include, for example, a photosensitive polymer. The photosensitive polymer may include, for example, one or more of photosensitive polyimide (PSPI), polybenzoxazole (PBO), phenolic polymer, and benzocyclobutene (BCB) polymer.

The first insulation pattern 310 is patterned to form a first opening 319 in the first insulation pattern 310. The first opening 319 exposes the capping pattern CP. The patterning of the first insulation pattern 310 may be performed, for example, by exposure and development processes. For example, in photolithography, a pattern preformed on a mask is transferred to a layer on a surface by imaging the pattern onto a photoresist which overlies the layer. Exposure processes as referred to herein may refer to such a process. Further, the development process as referred to herein may be, for example, a positive-tone development (PDT) process or a negative-tone development (NTD) process.

Figure 3C:
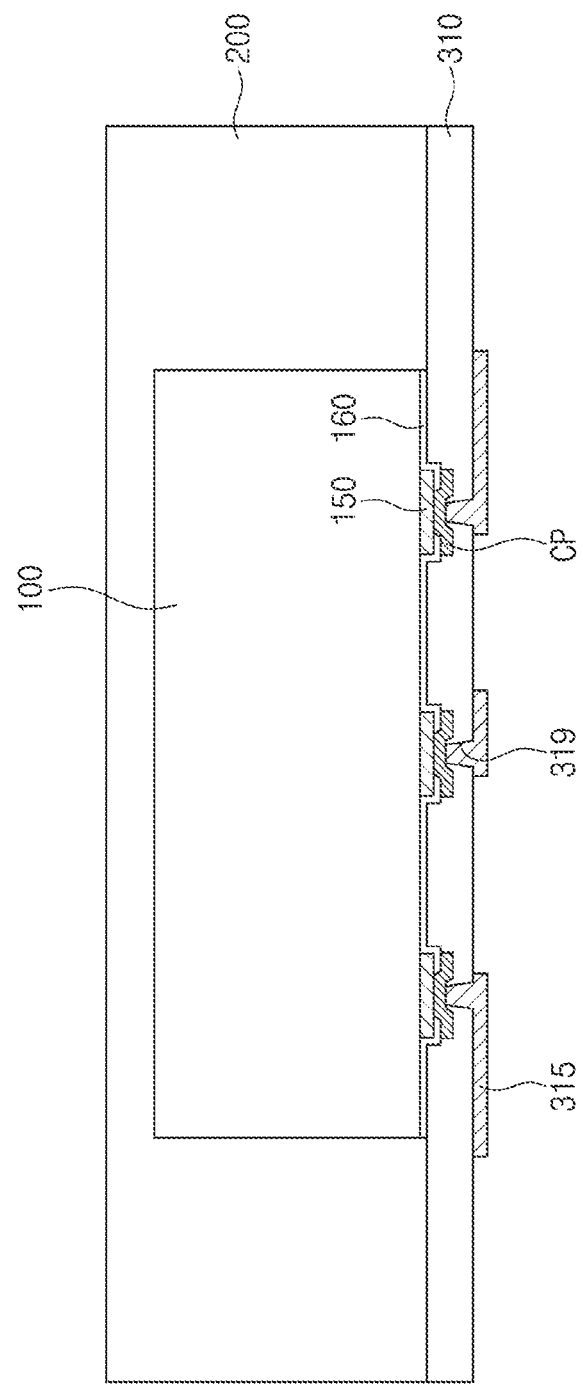

Referring to FIG. 3C, a first redistribution pattern 315 is formed in the first opening 319 and on the first insulation pattern 310. The first redistribution pattern 315 is coupled to the capping pattern CP. For example, in an exemplary embodiment, the first redistribution pattern 315 is in direct contact with the capping pattern CP, and is spaced apart from the chip pad 150. The first redistribution pattern 315 includes a via portion and a line portion. The via portion of the first redistribution pattern 315 is provided in the first opening 319, and the line portion of the first redistribution pattern 315 is disposed on a bottom surface of the first insulation pattern 310. The first redistribution pattern 315 may be configured such that the via portion is connected to the line portion. The first redistribution pattern 315 may include metal such as, for example, copper. The first redistribution pattern 315 may be formed by forming a seed pattern in the first opening 319 and on the first insulation pattern 310, and then performing an electroplating process that uses the seed pattern. A resist pattern may further be formed on the seed pattern, and the electroplating process may include selectively forming a metal pattern on the seed pattern exposed by the resist pattern. A removal process may be performed on a portion of the seed pattern exposed by the metal pattern. The seed pattern may include one or more of, for example, copper and titanium. The metal pattern may include, for example, copper. However, the formation of the first redistribution pattern 315 is not limited thereto, and may be changed according to exemplary embodiments of the inventive concept.

Figure 3D:
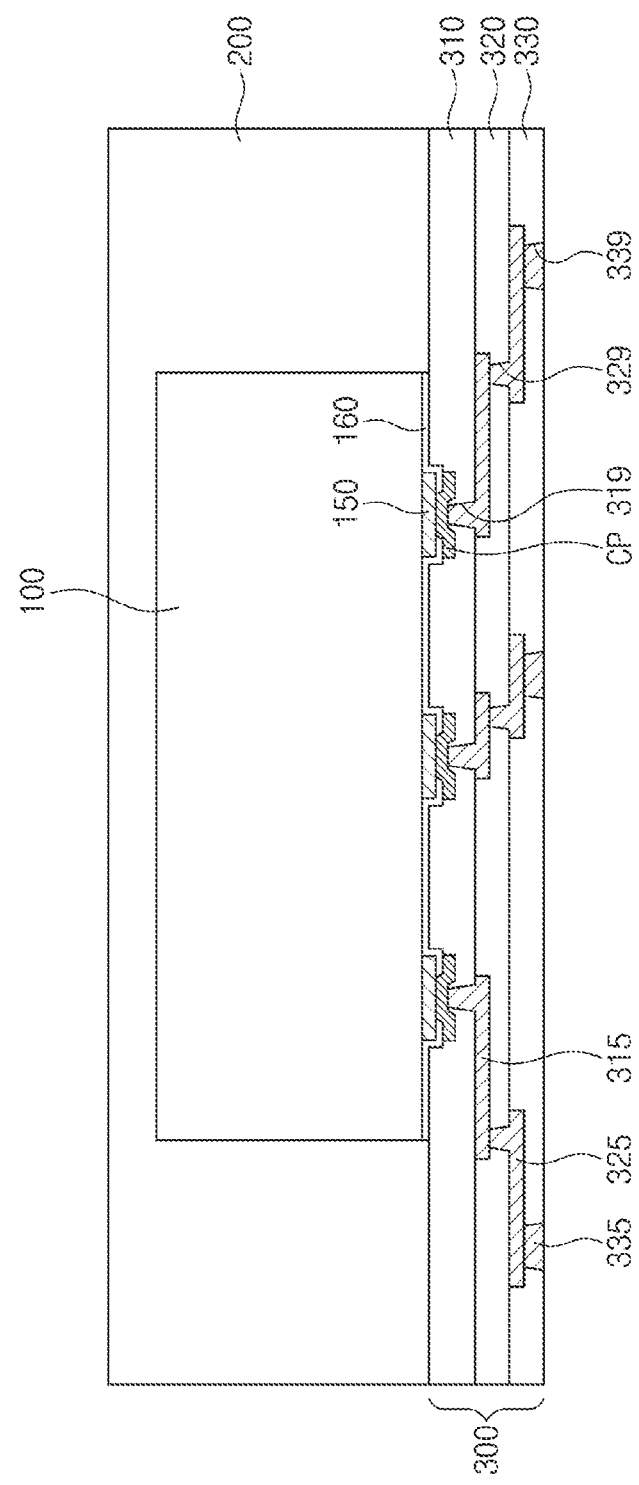

Referring to FIG. 3D, a second insulation pattern 320, a second redistribution pattern 325, a third insulation pattern 330, and a third redistribution pattern 335 are formed on the first insulation pattern 310. In exemplary embodiments, the second insulation pattern 320 covers the first redistribution pattern 315. The second insulation pattern 320 may be formed, for example, by a deposition or coating process. The second insulation pattern 320 may include, for example, a photosensitive polymer. Exposure and development processes may be performed such that the second insulation pattern 320 is patterned to form a second opening 329 in the second insulation pattern 320. The second opening 329 exposes the first redistribution pattern 315.

The second redistribution pattern 325 is formed in the second opening 329 and on a bottom surface of the second insulation pattern 320, and is coupled to the first redistribution pattern 315. The second redistribution pattern 325 may include a via portion and a line portion. For example, the second redistribution pattern 325 may be formed by forming a seed pattern in the second opening 329 and on the bottom surface of the second insulation pattern 320, and then performing an electroplating process that uses the seed pattern. The second redistribution pattern 325 may include, for example, copper.

The third insulation pattern 330 is formed on the bottom surface of the second insulation pattern 320 and covers the second redistribution pattern 325. The third insulation pattern 330 may include, for example, a photosensitive polymer. Exposure and development processes may be performed such that the third insulation pattern 330 is patterned to form a third opening 339 in the third insulation pattern 330. The third opening 339 exposes the second redistribution pattern 325. The third redistribution pattern 335 is formed in the third opening 339, and includes a conductive material such as, for example, copper. In exemplary embodiments, the third redistribution pattern 335 further extends onto the third insulation pattern 330. Through the processes described above, a redistribution layer 300 may be formed to include the first, second, and third insulation patterns 310, 320, and 330 and the first, second, and third redistribution patterns 315, 325, and 335.

The number of the insulation patterns 310, 320, and 330 and the number of the redistribution patterns 315, 325, and 335 may be variously changed. For example, in exemplary embodiments, the redistribution layer 300 may further include a fourth redistribution pattern and a fourth insulation pattern that are formed on the third insulation pattern 330. In other exemplary embodiments, the redistribution layer 300 may include neither the third redistribution pattern 335 nor the third insulation pattern 330.

Figure 3E:
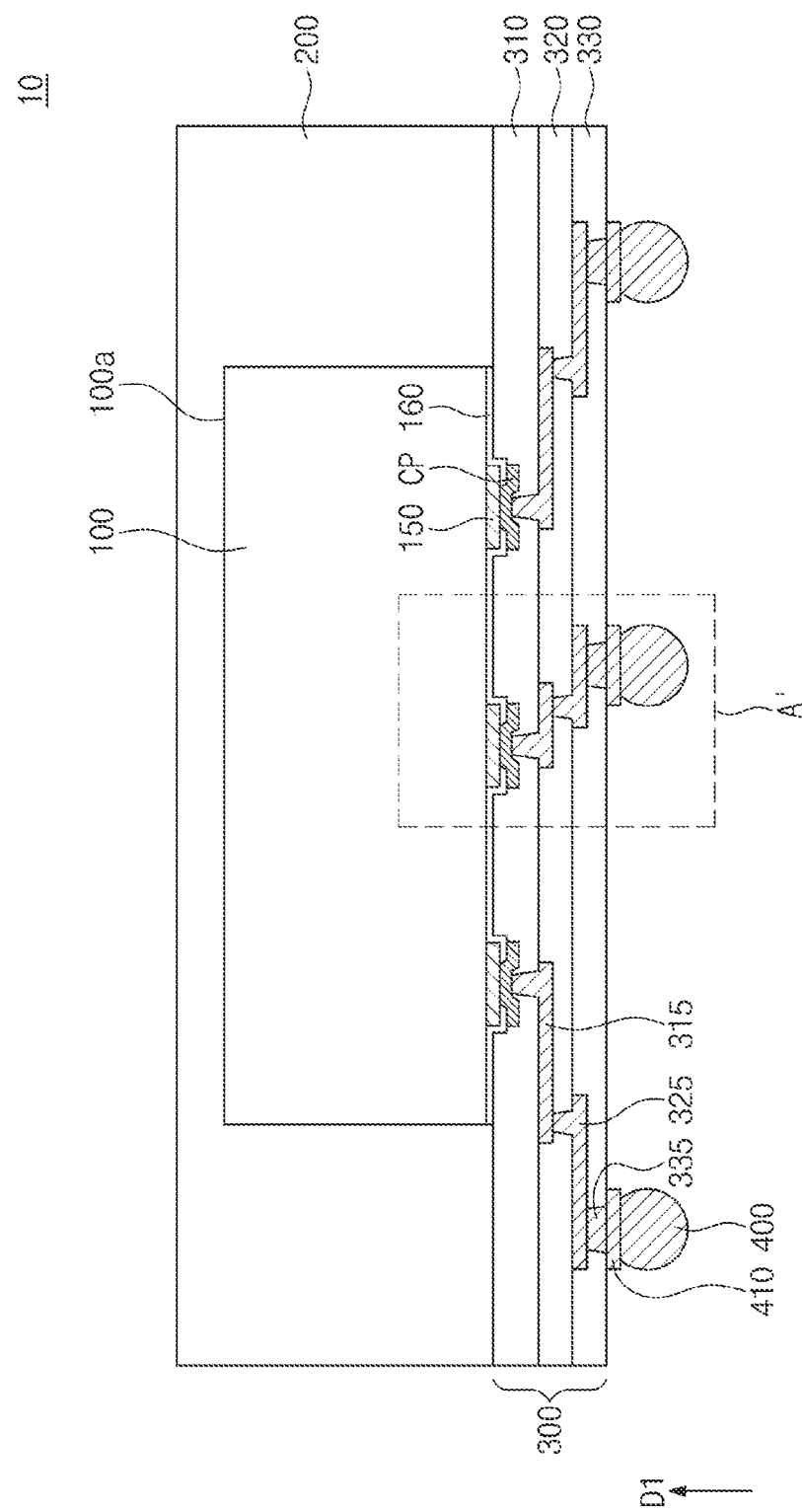
Figure 3F:
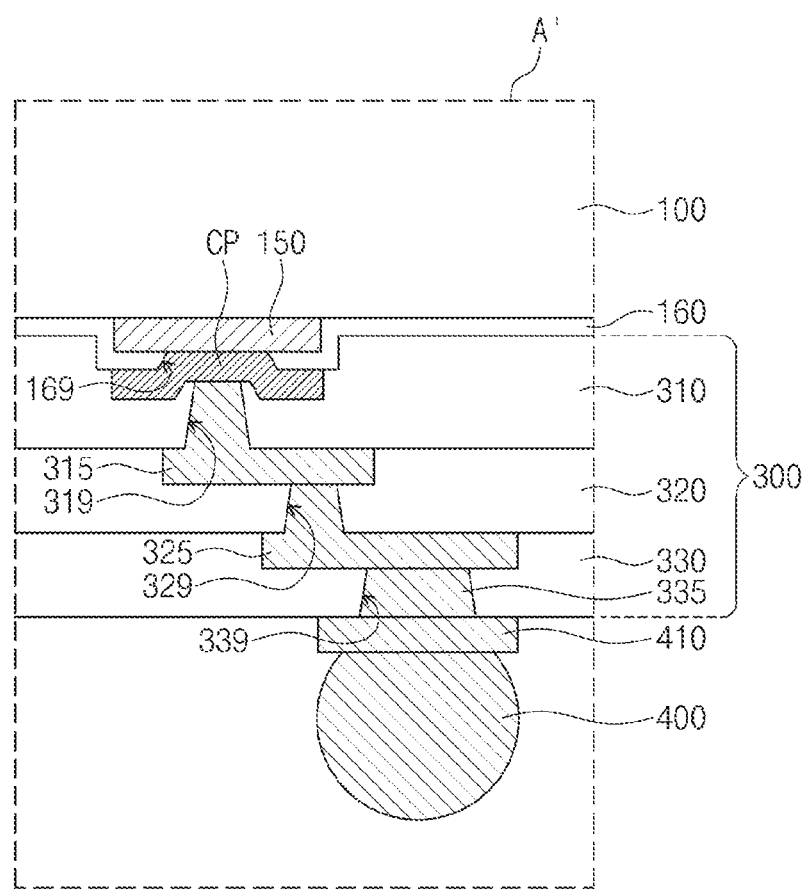
FIG. 3F illustrates an enlarged view showing section A' of FIG. 3E according to exemplary embodiments of the inventive concept.

Referring to FIGS. 3E and 3F, in an exemplary embodiment, a terminal pad 410 and an external terminal 400 are formed on the third redistribution pattern 335 exposed by the third insulation pattern 330. The terminal pad 410 is interposed between the external terminal 400 and the third redistribution pattern 335, and is electrically connected to the external terminal 400 and the third redistribution pattern 335. The external terminal 400 is electrically connected to the chip pad 150 through the redistribution patterns 315, 325, and 335 and the capping pattern CP. In this description, the phrase "electrically connected to the redistribution layer 300" means "electrically connected to at least one of the redistribution patterns 315, 325, and 335 of the redistribution layer 300." In an exemplary embodiment, when viewed in a plan view, the external terminal 400 does not overlap the capping pattern CP. For example, in an exemplary embodiment, the external terminal 400 is not aligned with the capping pattern CP along a first direction D1. The first direction D1 is substantially perpendicular to the top surface 100a of the semiconductor device 100. In an exemplary embodiment, when viewed in a plan view, the external terminal 400 overlaps the molding pattern 200. Since the redistribution patterns 315, 325, and 335 are provided, the arrangement of the external terminal 400 is not limited by the arrangement of the capping pattern CP. The external terminal 400 may include, for example, one or more of a solder ball, a bump, and a pillar. The external terminal 400 may include a conductive material such as, for example, metal. Through the processes described above, a semiconductor package 10 may be fabricated.

As shown in FIG. 3F, in an exemplary embodiment, the capping pattern CP is formed on the chip pad 150, the passivation pattern 160 exposes a portion of the chip pad 150, and the capping pattern CP covers the exposed portion of the chip pad 150. The first opening 319 is formed in the first insulation pattern 310 by, for example, performing exposure and development processes on the first insulation pattern 310. The first opening 319 exposes a portion of the capping pattern CP, and the first redistribution pattern 315 is formed in the first opening 319 such that it contacts the exposed portion of the capping pattern CP.

In exemplary embodiments, the redistribution layer 300 has a thickness less than that of a printed circuit board (PCB). Thus, the size of the semiconductor package 10 that includes the redistribution layer 300 may be reduced, and a compact-sized semiconductor package 10 may be realized.

Figure 4A:
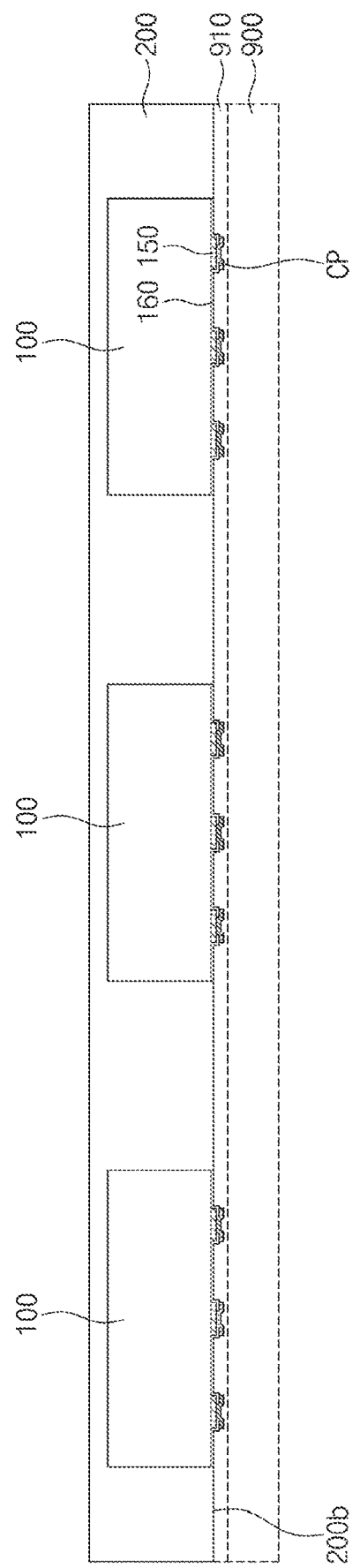
FIGS. 4A and 4B illustrate cross-sectional views showing a method of fabricating a semiconductor package according to exemplary embodiments of the inventive concept.
Figure 4B:
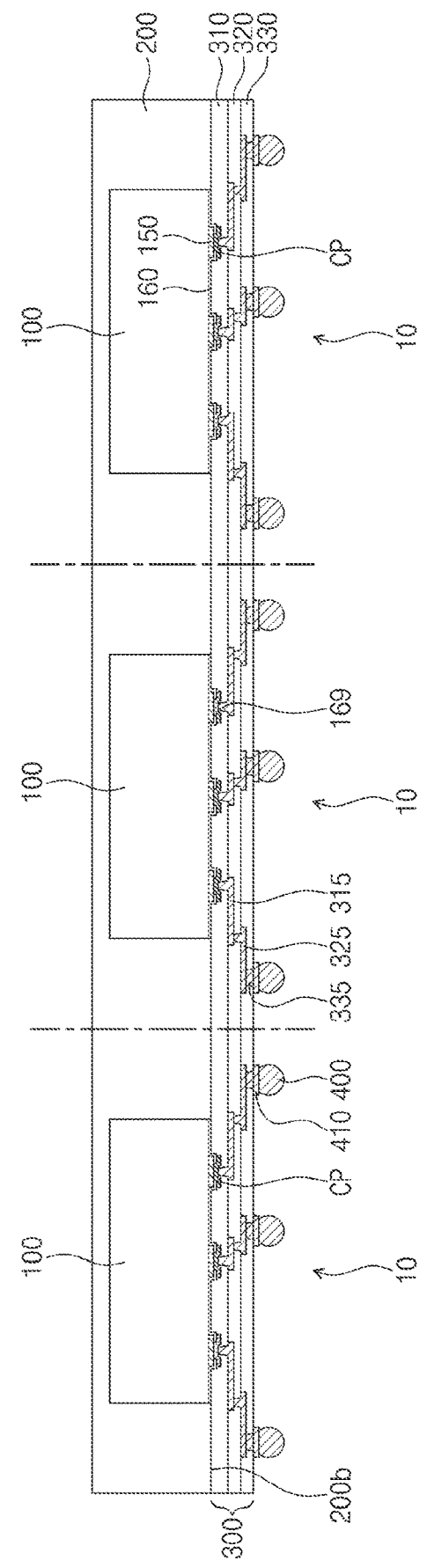

FIGS. 4A and 4B illustrate cross-sectional views showing a method of fabricating a semiconductor package according to exemplary embodiments of the inventive concept. For convenience of explanation, a further description of elements and processes previously described may be omitted below.

Referring to FIG. 4A, the semiconductor device 100 is disposed on the carrier substrate 900. The semiconductor device 100 includes the capping pattern CP. A plurality of the semiconductor devices 100 is disposed on the carrier substrate 900. The plurality of semiconductor devices 100 is adhered to the carrier substrate 900 via the carrier adhesive layer 910. The molding pattern 200 is disposed on the carrier substrate 900 and covers the semiconductor devices 100. The carrier adhesive layer 910 and the carrier substrate 900 are removed to expose the bottom surface 200b of the molding pattern 200, the surface 160b of the passivation pattern 160, and the capping pattern CP. The capping pattern CP prevents the chip pad 150 from being exposed to the outside.

Referring to FIG. 4B, the redistribution layer 300 is formed on the exposed capping pattern CP, the exposed surface 160b of the passivation pattern 160, and the exposed bottom surface 200b of the molding pattern 200. The redistribution layer 300 includes the insulation patterns 310, 320, and 330 and the redistribution patterns 315, 325, and 335. The redistribution layer 300 may be formed by the same processes as those described above with reference to FIGS. 3B to 3D. In an exemplary embodiment, the redistribution layer 300 is formed at a panel or wafer level. The terminal pad 410 and the external terminal 400 are formed on a bottom surface of the redistribution layer 300. The molding pattern 200 and the redistribution layer 300 may be diced along a dot-and-dash line, which may result in fabricating a plurality of semiconductor packages 10 separated from one another. The semiconductor packages 10 may be fabricated at a chip, panel, or wafer level. For convenience of explanation, the following description refers to a single semiconductor package 10. However, it is to be understood that the method of fabricating a semiconductor package as described below is not limited to chip-level fabrication.

Figure 5:
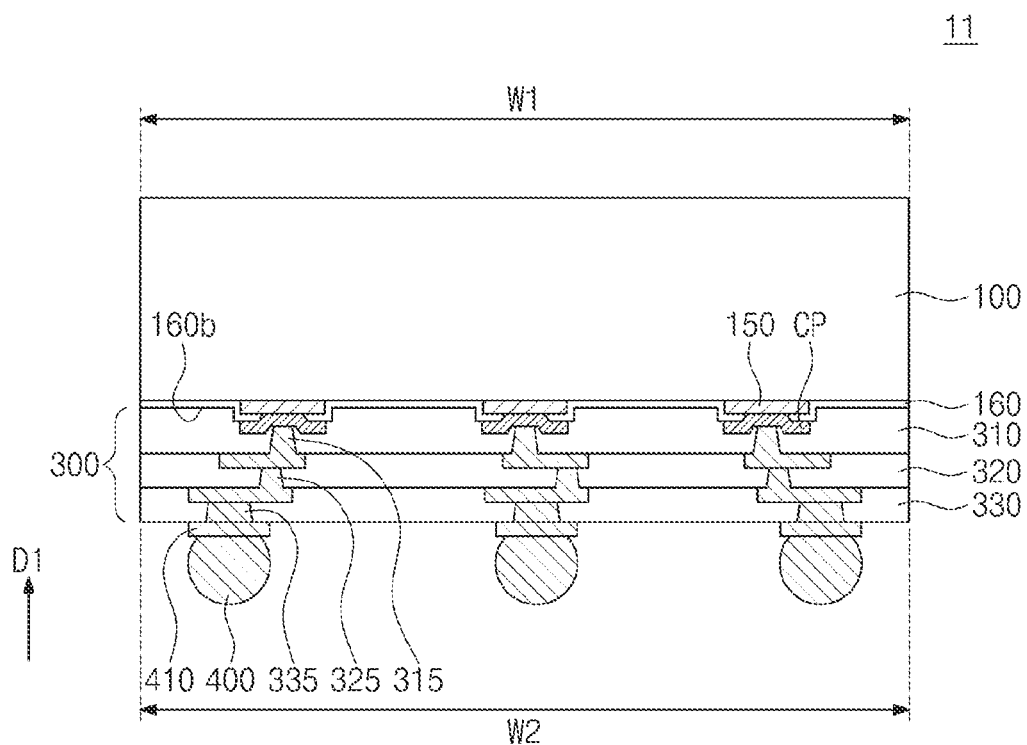
FIG. 5 illustrates a cross-sectional view showing a semiconductor package according to exemplary embodiments of the inventive concept.

FIG. 5 illustrates a cross-sectional view showing a semiconductor package according to exemplary embodiments of the inventive concept. For convenience of explanation, a further description of elements and processes previously described may be omitted below.

Referring to FIG. 5, in an exemplary embodiment, a semiconductor package 11 includes the redistribution layer 300 and the semiconductor device 100. Unlike the semiconductor package 10 of FIG. 3E, the semiconductor package 11 does not include the molding pattern 200. The semiconductor device 100 has a width W1 that is about equal to the width W2 of the redistribution layer 300.

The first insulation pattern 310, the first redistribution pattern 315, the second insulation pattern 320, the second redistribution pattern 325, the third insulation pattern 330, and the third redistribution pattern 335 may be sequentially formed on the bottom surface of the semiconductor device 100, thereby forming the redistribution layer 300. The first insulation pattern 310 covers the surface 160b of the passivation pattern 160 and the capping pattern CP. The capping pattern CP prevents the first insulation pattern 310 from contacting the chip pad 150. The redistribution layer 300 may be formed by the same processes as those described above with reference to FIGS. 3B to 3D.

Figure 6A:
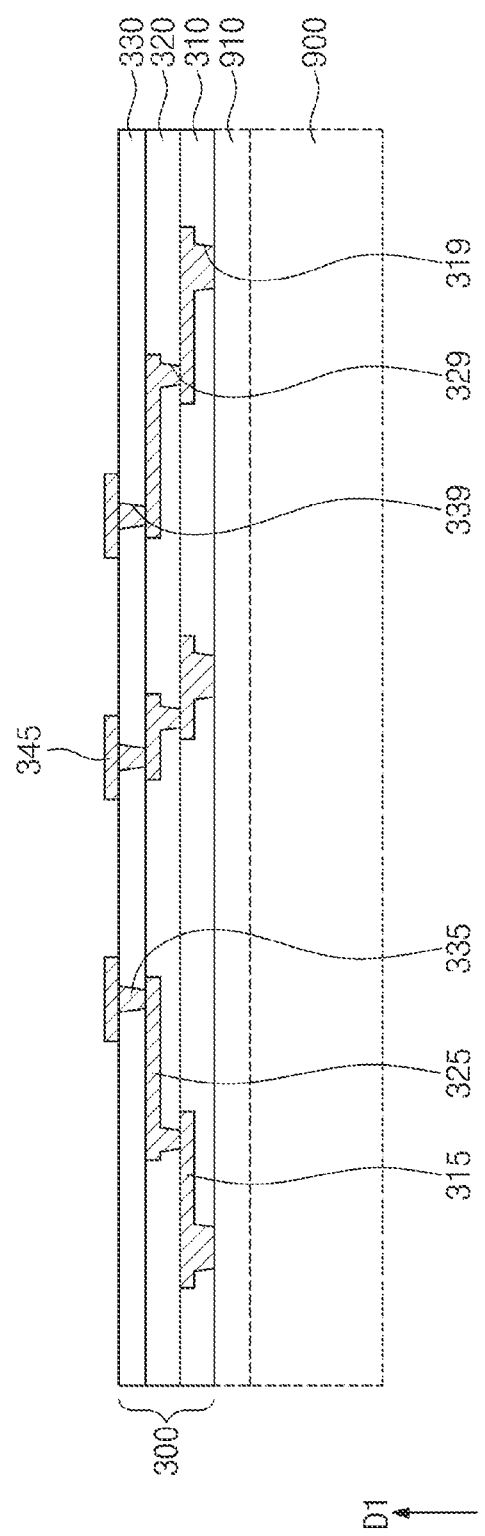
FIGS. 6A to 6C illustrate cross-sectional views showing a method of fabricating a semiconductor package according to exemplary embodiments of the inventive concept.
Figure 6B:
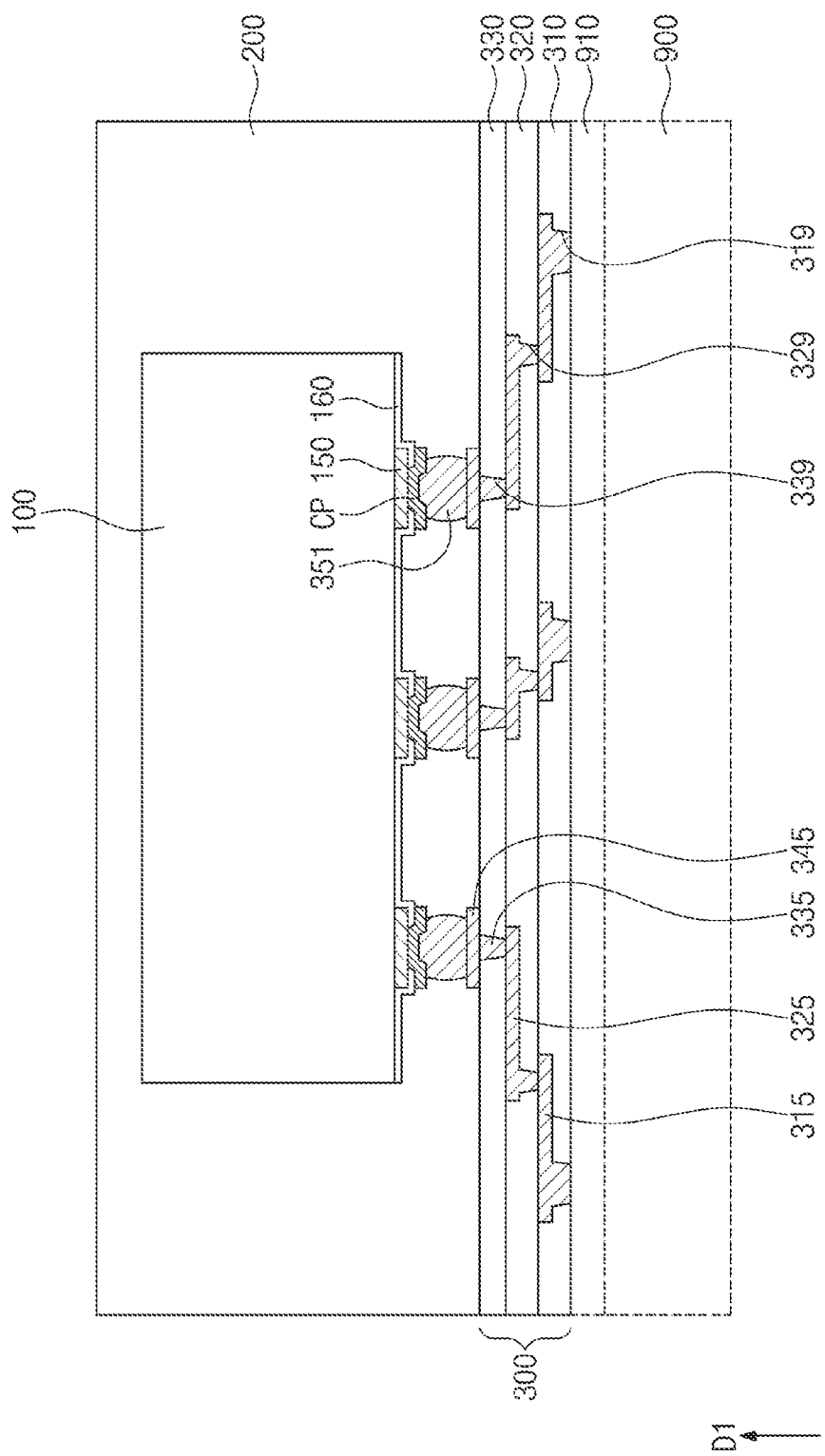
Figure 6C:
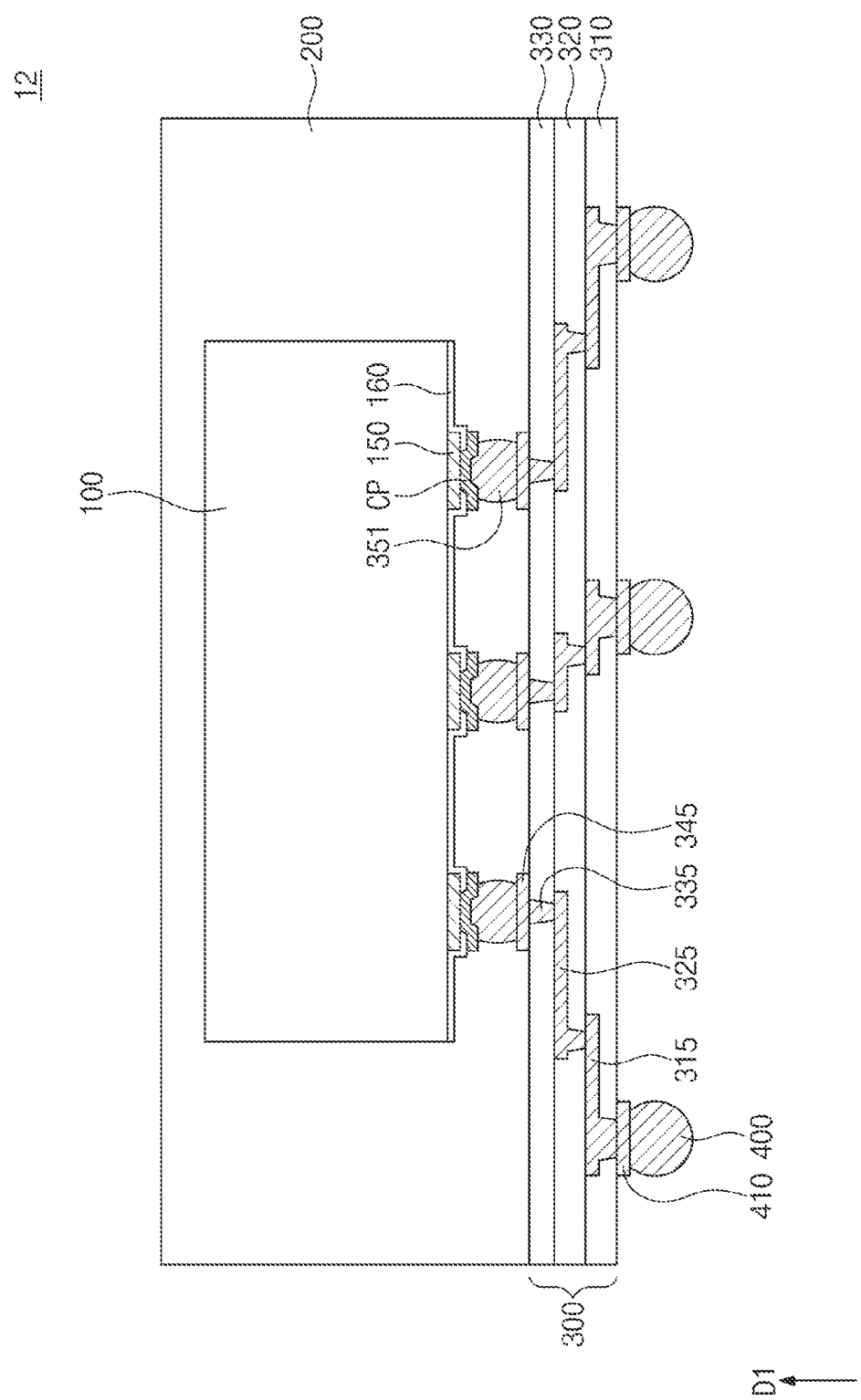

FIGS. 6A to 6C illustrate cross-sectional views showing a method of fabricating a semiconductor package according to exemplary embodiments of the inventive concept. For convenience of explanation, a further description of elements and processes previously described may be omitted below.

Referring to FIG. 6A, the first insulation pattern 310, the first redistribution pattern 315, the second insulation pattern 320, the second redistribution pattern 325, the third insulation pattern 330, and the third redistribution pattern 335 are formed on the carrier substrate 900, thereby forming the redistribution layer 300. The first insulation pattern 310 is formed on the carrier substrate 900. The carrier adhesive layer 910 is further interposed between the first insulation pattern 310 and the carrier substrate 900. The first insulation pattern 310 may include, for example, a photosensitive polymer. In exemplary embodiments, the first insulation pattern 310 is patterned to form the first opening 319 in the first insulation pattern 310. The patterning of the first insulation pattern 310 may be performed, for example, by exposure and development processes. The first opening 319 exposes the carrier adhesive layer 910 or the carrier substrate 900. The first redistribution pattern 315 is formed in the first opening 319 and on the first insulation pattern 310.

The second insulation pattern 320, the second redistribution pattern 325, the third insulation pattern 330, and the third redistribution pattern 335 may be formed by the processes described above with reference to FIGS. 3C and 3D. The second insulation pattern 320 may include, for example, a photosensitive polymer. The second insulation pattern 320 includes the second opening 329 that exposes the first redistribution pattern 315. The second redistribution pattern 325 is formed in the second opening 329 and on the second insulation pattern 320, and is electrically connected to the first redistribution pattern 315. The third insulation pattern 330 is formed on the second insulation pattern 320 and covers the second redistribution pattern 325. The third insulation pattern 330 may include, for example, a photosensitive polymer. The third insulation pattern 330 includes the third opening 339. The third redistribution pattern 335 is disposed in the third opening 339 and is electrically connected to the second redistribution pattern 325. The third insulation pattern 330 exposes a portion of the third redistribution pattern 335. A first conductive pad 345 is formed on the exposed portion of the third redistribution pattern 335 and is electrically connected to the third redistribution pattern 335.

Referring to FIG. 6B, the semiconductor device 100 is disposed on the redistribution layer 300, for example, on the third insulation pattern 330. The semiconductor device 100 includes the capping pattern CP, and the capping pattern CP faces the redistribution layer 300. In an exemplary embodiment, the capping pattern CP is aligned with the first conductive pad 345. A first connector 351 is formed between the capping pattern CP and the first conductive pad 345. In an exemplary embodiment, the first connector 351 is spaced apart and physically separated from the chip pad 150, and is in direct and physical contact with the capping pattern CP. The semiconductor device 100 is electrically connected to the redistribution patterns 315, 325, and 335 via the first connector 351. The first connector 351 may be, for example, a solder ball, bump, or pillar. The molding pattern 200 is formed on the redistribution layer 300 and covers the semiconductor device 100. In an exemplary embodiment, the molding pattern 200 further extends into a gap between the semiconductor device 100 and the third insulation pattern 330, thereby encapsulating the first connector 351. Alternatively, in an exemplary embodiment, an under-fill pattern may further be formed to fill the gap between the semiconductor device 100 and the third insulation pattern 330. The carrier adhesive layer 910 and the carrier substrate 900 are removed to expose the first insulation pattern 310 and a portion of the first redistribution pattern 315.

Referring to FIG. 6C, in an exemplary embodiment, the terminal pad 410 and the external terminal 400 are formed on the bottom surface of the redistribution layer 300. The terminal pad 410 is formed between the external terminal 400 and the exposed portion of the first redistribution pattern 315. The external terminal 400 is formed on the terminal pad 410 and is electrically connected to the redistribution patterns 315, 325, and 335. Through the processes described above, a semiconductor package 12 may be fabricated.

Alternatively, in an exemplary embodiment, the molding pattern 200 is omitted and the semiconductor device 100 has a width that is substantially the same as the width of the redistribution layer 300, as illustrated in FIG. 5.

Figure 7:
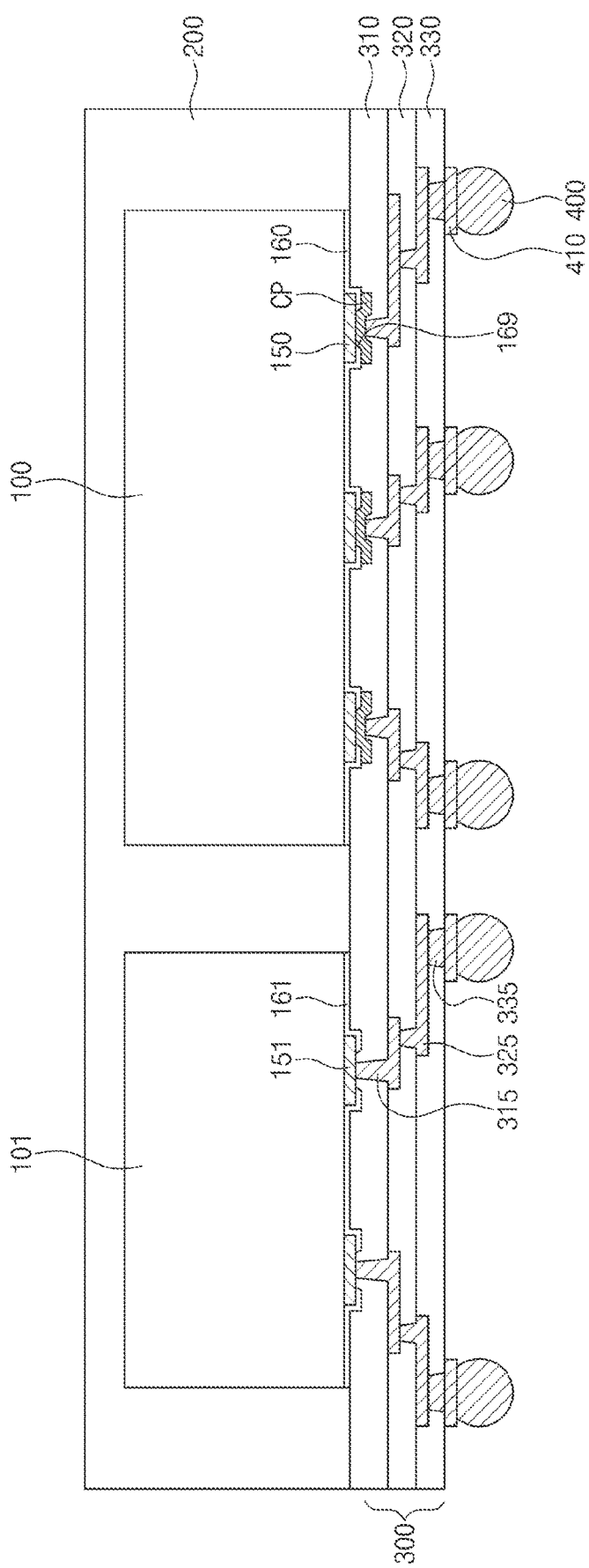
FIG. 7 illustrates a cross-sectional view showing a semiconductor package according to exemplary embodiments of the inventive concept.

FIG. 7 illustrates a cross-sectional view showing a semiconductor package according to exemplary embodiments of the inventive concept. For convenience of explanation, a further description of elements and processes previously described may be omitted below.

Referring to FIG. 7, in an exemplary embodiment, a semiconductor package 13 includes a semiconductor chip 101 in addition to the redistribution layer 300, the semiconductor device 100, and the molding pattern 200. The semiconductor device 100 may be the semiconductor device 100 described above with reference to FIGS. 1A to 2G. For example, in the semiconductor device 100 shown in FIG. 7, the capping pattern CP covers the chip pad 150 exposed through the pad opening 169.

The semiconductor chip 101 may have a function identical to or different from that of the semiconductor device 100. The semiconductor chip 101 may include, for example, a contact chip pad 151 and a passivation layer 161. The contact chip pad 151 may be electrically connected to integrated circuits of the semiconductor chip 101. The semiconductor chip 101 does not include the capping pattern CP. In such a configuration, the contact chip pad 151 is exposed at a bottom surface of the semiconductor chip 101.

In an exemplary embodiment, the redistribution layer 300, the semiconductor device 100, and the molding pattern 200 may be formed and disposed by the processes described above with reference to FIGS. 3A to 3D. In an exemplary embodiment, the first redistribution pattern 315 is in direct and physical contact with the contact chip pad 151. Alternatively, in an exemplary embodiment, the redistribution layer 300 may be formed by the processes described above with reference to FIGS. 6A to 6C. In this case, the first connector 351 (see FIG. 6C) may be provided in plural, and the plurality of first connectors 351 may be interposed between the redistribution layer 300 and the contact chip pad 151, and between the redistribution layer 300 and the capping pattern CP. The contact chip pad 151 may be directly coupled to one of the first connectors 351.

Figure 8:
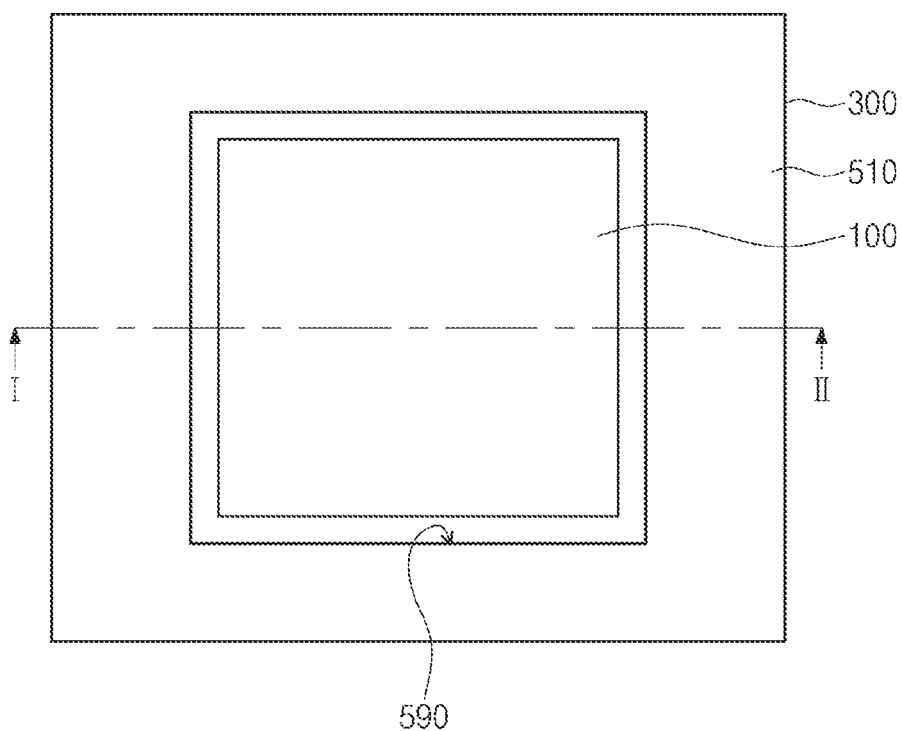
FIG. 8 illustrates a plan view showing a semiconductor package according to exemplary embodiments of the inventive concept.
Figure 9B:
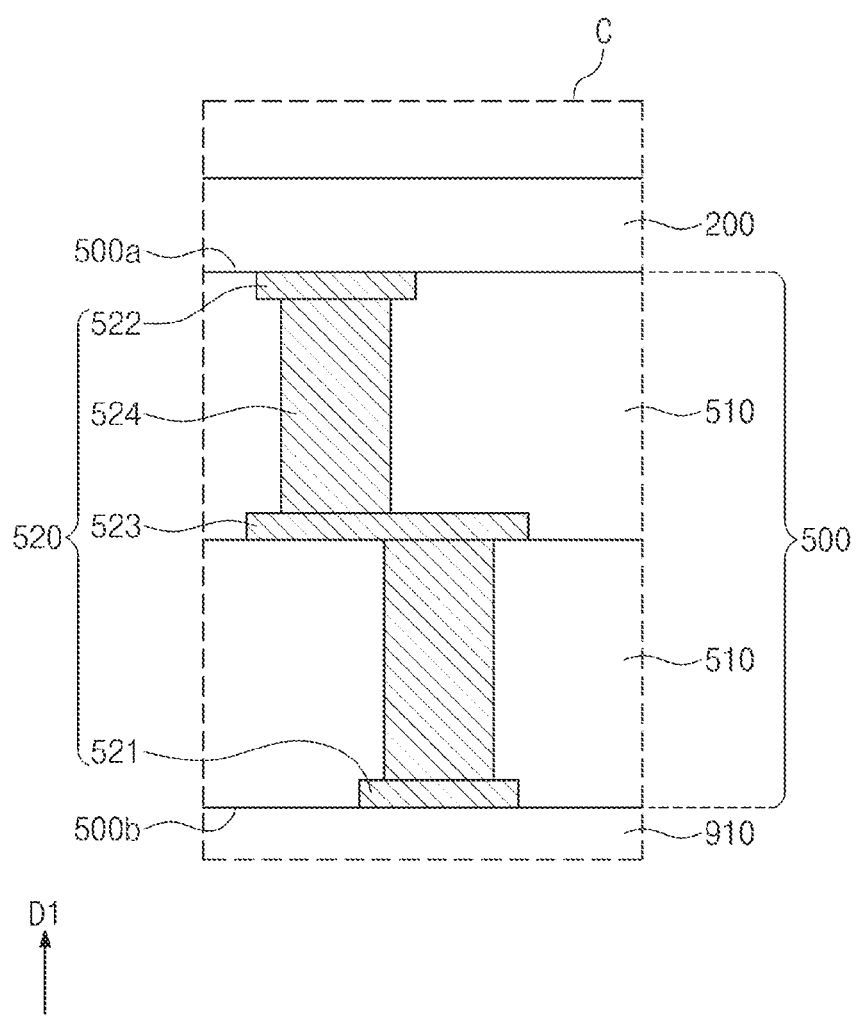
FIG. 9B illustrates an enlarged view showing section C of FIG. 9A according to exemplary embodiments of the inventive concept.
Figure 9C:
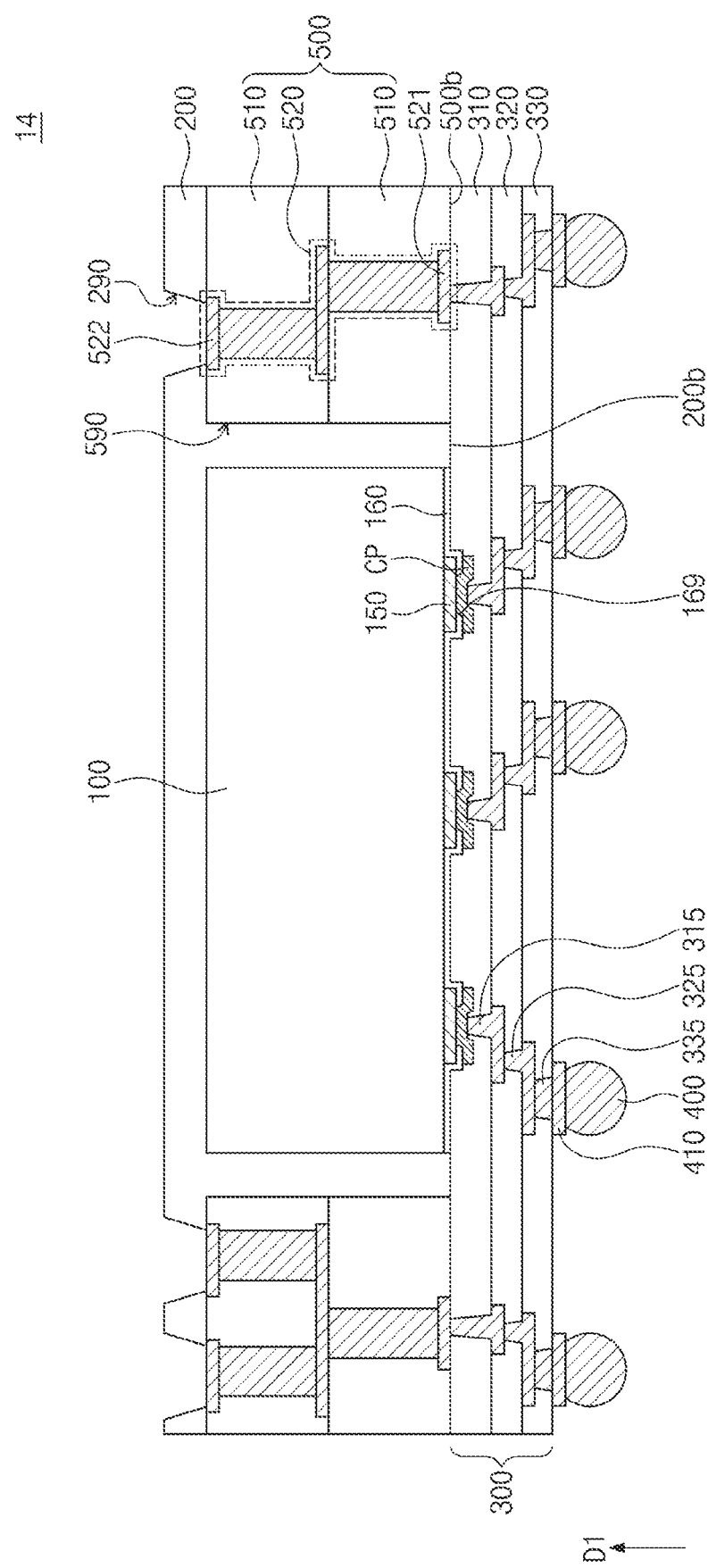

FIG. 8 illustrates a plan view showing a semiconductor package according to exemplary embodiments of the inventive concept. FIGS. 9A and 9C illustrate cross-sectional views taken along line I-II of FIG. 8, showing a method of fabricating a semiconductor package according to exemplary embodiments of the inventive concept. FIG. 9B illustrates an enlarged view showing section C of FIG. 9A according to exemplary embodiments of the inventive concept. For convenience of explanation, a further description of elements and processes previously described may be omitted below.

Referring to FIGS. 8, 9A, and 9B, in an exemplary embodiment, a connection substrate 500 is disposed on the carrier substrate 900. The carrier adhesive layer 910 is further disposed between the connection substrate 500 and the carrier substrate 900. The connection substrate 500 includes a hole 590 penetrating through the connection substrate 500. For example, in an exemplary embodiment, the hole 590 is formed in a printed circuit board (PCB), and the printed circuit board having the hole 590 is used as the connection substrate 500. In an exemplary embodiment, the hole 590 entirely penetrates the connection substrate 500. When viewed in a plan view, the hole 590 may be formed on a central portion of the connection substrate 500. The hole 590 exposes the carrier adhesive layer 910 or the carrier substrate 900. The connection substrate 500 includes a base layer 510 and a conductive structure 520. The base layer 510 includes a plurality of stacked base layers 510. The plurality of base layers 510 may include an insulating material. For example, the base layers 510 may include a carbon material (e.g., graphite or graphene), a ceramic, or a polymer (e.g., nylon, polycarbonate, or polyethylene). The hole 590 penetrates the base layers 510. The conductive structure 520 is disposed in the base layers 510. As illustrated in FIG. 9B, in an exemplary embodiment, the conductive structure 520 includes a first pad 521, a conductive line 523, vias 524, and a second pad 522. The first pad 521 is disposed on a bottom surface 500b of the connection substrate 500. The conductive line 523 is interposed between the base layers 510. The vias 524 penetrate the base layers 510 and connect to the conductive line 523. The second pad 522 is disposed on a top surface 500a of the connection substrate 500 and coupled to at least one of the vias 524. The second pad 522 is electrically connected to the first pad 521 through the vias 524 and the conductive line 523. In an exemplary embodiment, the second pad 522 and the first pad 521 do not align with each other along the first direction D1. The second pad 522 and the first pad 521 may differ from each other in number or arrangement. The conductive structure 520 may include metal. For example, the conductive structure 520 may include one or more of copper, aluminum, gold, lead, stainless steel, silver, iron, and an alloy thereof.

As illustrated in FIG. 9A, in an exemplary embodiment, the semiconductor device 100 is disposed on the carrier substrate 900. The semiconductor device 100 includes the capping pattern CP, as described with reference to FIGS. 1A to 1C. When viewed in a plan view, the semiconductor device 100 may be disposed on a central portion of the carrier substrate 900. The capping pattern CP faces the carrier substrate 900. The semiconductor device 100 is disposed in the hole 590 of the connection substrate 500. The semiconductor device 100 may be provided before or after the connection substrate 500 is disposed.

The molding pattern 200 is formed on the semiconductor device 100 and the connection substrate 500. The molding pattern 200 may fill a gap between the semiconductor device 100 and the connection substrate 500. In this case, the molding pattern 200 may affix the semiconductor device 100 to the connection substrate 500. The molding pattern 200 may include an insulating polymer such as, for example, an epoxy-based polymer. For example, the molding pattern 200 may include an adhesive insulation film such as, for example, an Ajinomoto Build-up Film (ABF). The molding pattern 200 may be formed by attaching an adhesive insulation film onto the connection substrate 500 and the semiconductor device 100.

The carrier adhesive layer 910 and the carrier substrate 900 are removed to expose the capping pattern CP, the passivation pattern 160, the bottom surface 200b of the molding pattern 200, and the bottom surface 500b of the connection substrate 500.

Referring to FIGS. 8 and 9C, in an exemplary embodiment, the first insulation pattern 310, the first redistribution pattern 315, the second insulation pattern 320, the second redistribution pattern 325, the third insulation pattern 330, and the third redistribution pattern 335 are sequentially formed on the capping pattern CP, the passivation pattern 160, and the bottom surface 200b of the molding pattern 200, thereby forming the redistribution layer 300. The redistribution layer 300 may be formed by substantially the same processes as those described above with reference to FIGS. 3B to 3D. The redistribution layer 300 extends onto the bottom surface 500b of the connection substrate 500. The first insulation pattern 310 covers the capping pattern CP, the surface 160b of the passivation pattern 160, the bottom surface 200b of the molding pattern 200, and the bottom surface 500b of the connection substrate 500. In an exemplary embodiment, the first insulation pattern 310 is in direct and physical contact with the capping pattern CP, the passivation pattern 160, the molding pattern 200, and the connection substrate 500. The first redistribution pattern 315 may be provided in plural. One of the plurality of first redistribution patterns 315 may be electrically connected to the capping pattern CP, and another one of the plurality of first redistribution patterns 315 may be electrically connected to the first pad 521. The capping pattern CP is electrically connected to the external terminal 400 or the first pad 521 through the redistribution patterns 315, 325, and 335. In exemplary embodiments, the conductive structure 520 is electrically connected to the external terminal 400 or the semiconductor device 100 via the redistribution patterns 315, 325, and 335.

In an exemplary embodiment, an upper hole 290 is formed in the molding pattern 200 and exposes the second pad 522 of the conductive structure 520. Through the processes described above, a semiconductor package 14 may be fabricated.

Figure 9D:
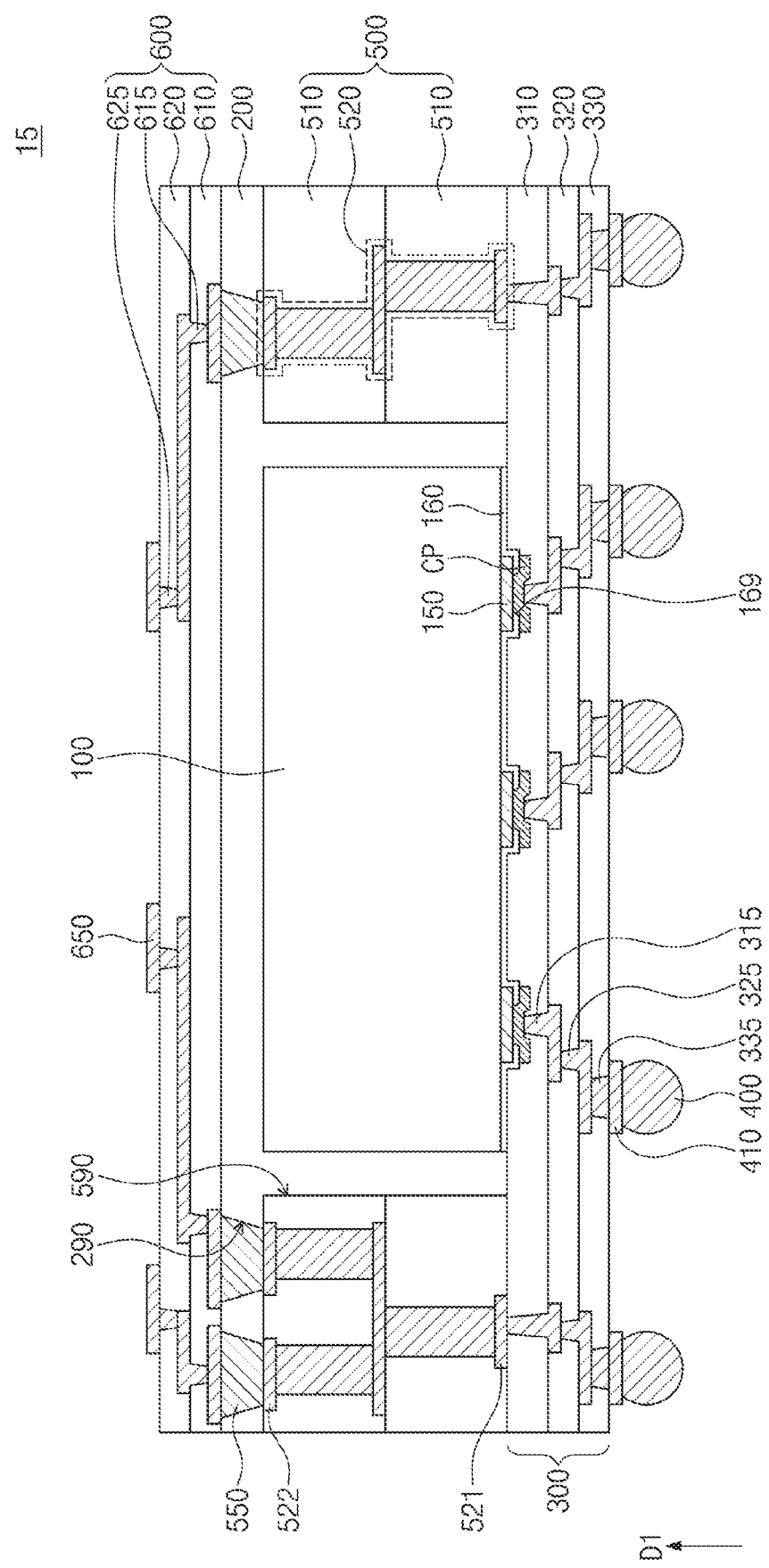
FIG. 9D illustrates a cross-sectional view showing a semiconductor package according to exemplary embodiments of the inventive concept.

FIG. 9D illustrates a cross-sectional view taken along line I-II of FIG. 8, showing a semiconductor package according to exemplary embodiments of the inventive concept. For convenience of explanation, a further description of elements and processes previously described may be omitted below.

Referring to FIGS. 8 and 9D, in an exemplary embodiment, a semiconductor package 15 includes an upper redistribution layer 600 in addition to the redistribution layer 300, the semiconductor device 100, the connection substrate 500, and the molding pattern 200. The arrangement of the connection substrate 500, the providing of the semiconductor device 100, the formation of the redistribution layer 300, and the formation of the molding pattern 200 may be substantially the same as those described above with reference to FIGS. 9A to 9C. In exemplary embodiments, a conductor 550 is formed in the upper hole 290 and fills the upper hole 290. The conductor 550 may include, for example, metal.

The upper redistribution layer 600 is disposed on a top surface of the molding pattern 200. The upper redistribution layer 600 includes a first upper insulation pattern 610, a second upper insulation pattern 620, a first upper redistribution pattern 615, and a second upper redistribution pattern 625. The first upper insulation pattern 610 is disposed on the molding pattern 200. The first upper insulation pattern 610 may include, for example, a photosensitive polymer. The first upper redistribution pattern 615 is disposed on the first upper insulation pattern 610 and extends into the first upper insulation pattern 610. The first upper redistribution pattern 615 is coupled to the conductor 550. The second upper insulation pattern 620 is disposed on the first upper insulation pattern 610 and covers the first upper redistribution pattern 615. The second upper insulation pattern 620 may include, for example, a photosensitive polymer. The second upper redistribution pattern 625 is disposed in the second upper insulation pattern 620. In an exemplary embodiment, the second upper redistribution pattern 625 may further extend onto a top surface of the second upper insulation pattern 620. The first and second upper redistribution patterns 615 and 625 may include metal such as, for example, copper. The upper redistribution layer 600 may be formed by substantially the same processes used to form the redistribution layer 300 as described above with reference to FIGS. 3B to 3D. The number of the upper insulation patterns 610 and 620 and the number of the upper redistribution patterns 615 and 625 may be variously changed. A second conductive pad 650 is formed on the upper redistribution layer 600 and coupled to the second upper redistribution pattern 625. The second conductive pad 650 is electrically connected to the semiconductor device 100 or the external terminal 400 via the upper redistribution patterns 615 and 625 and the conductive structure 520. The second conductive pad 650 may include, for example, metal. In an exemplary embodiment, the second conductive pad 650 does not align with the second pad 522 along the first direction D1. For example, in an exemplary embodiment, when viewed in a plan view, the second conductive pad 650 overlaps the semiconductor device 100. The arrangement of the second conductive pad 650 is not restricted by the arrangement of the second pad 522.

Figure 9E:
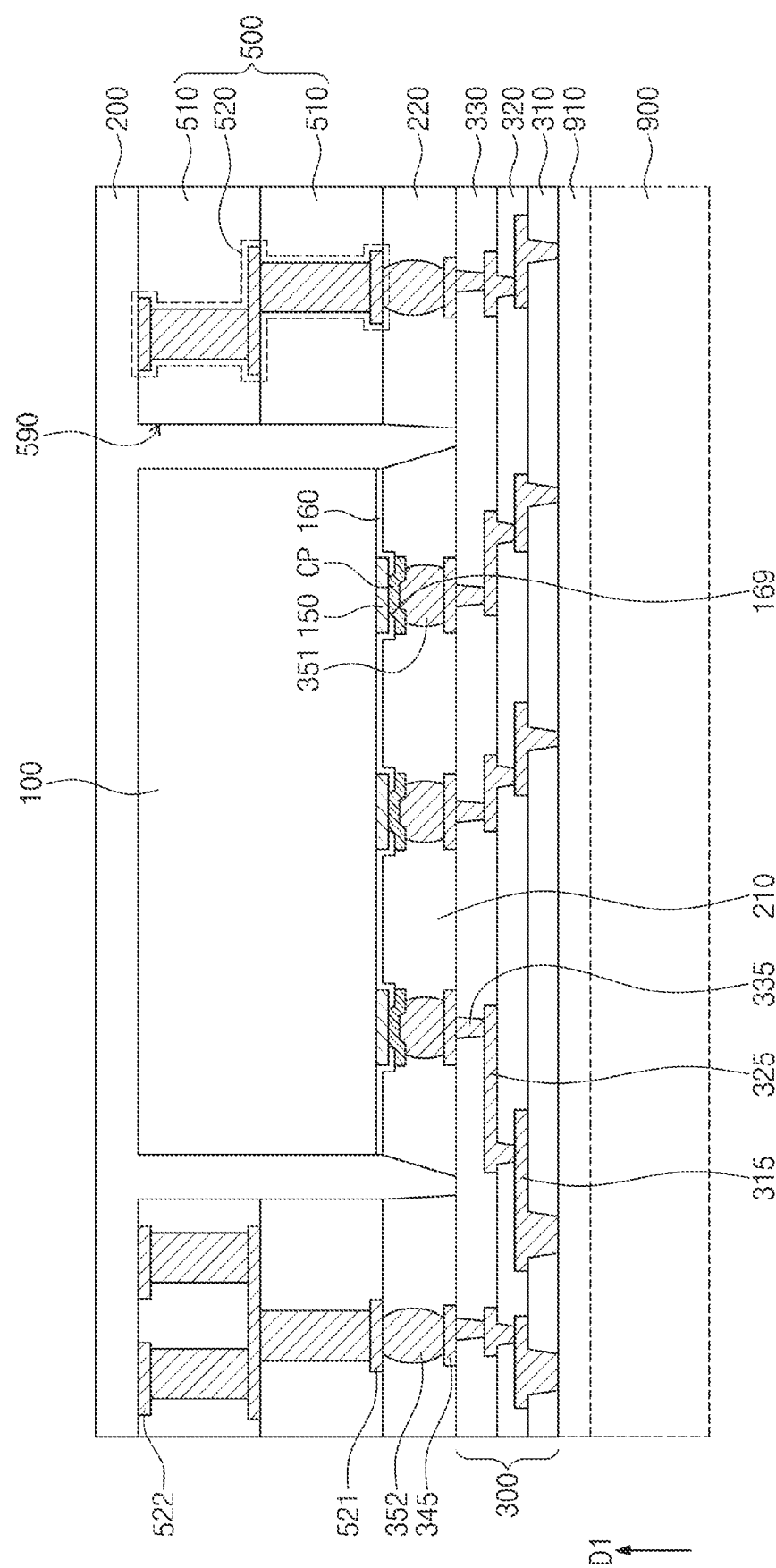
FIGS. 9E and 9F illustrate cross-sectional views showing a method of fabricating a semiconductor package according to exemplary embodiments of the inventive concept.
Figure 9F:
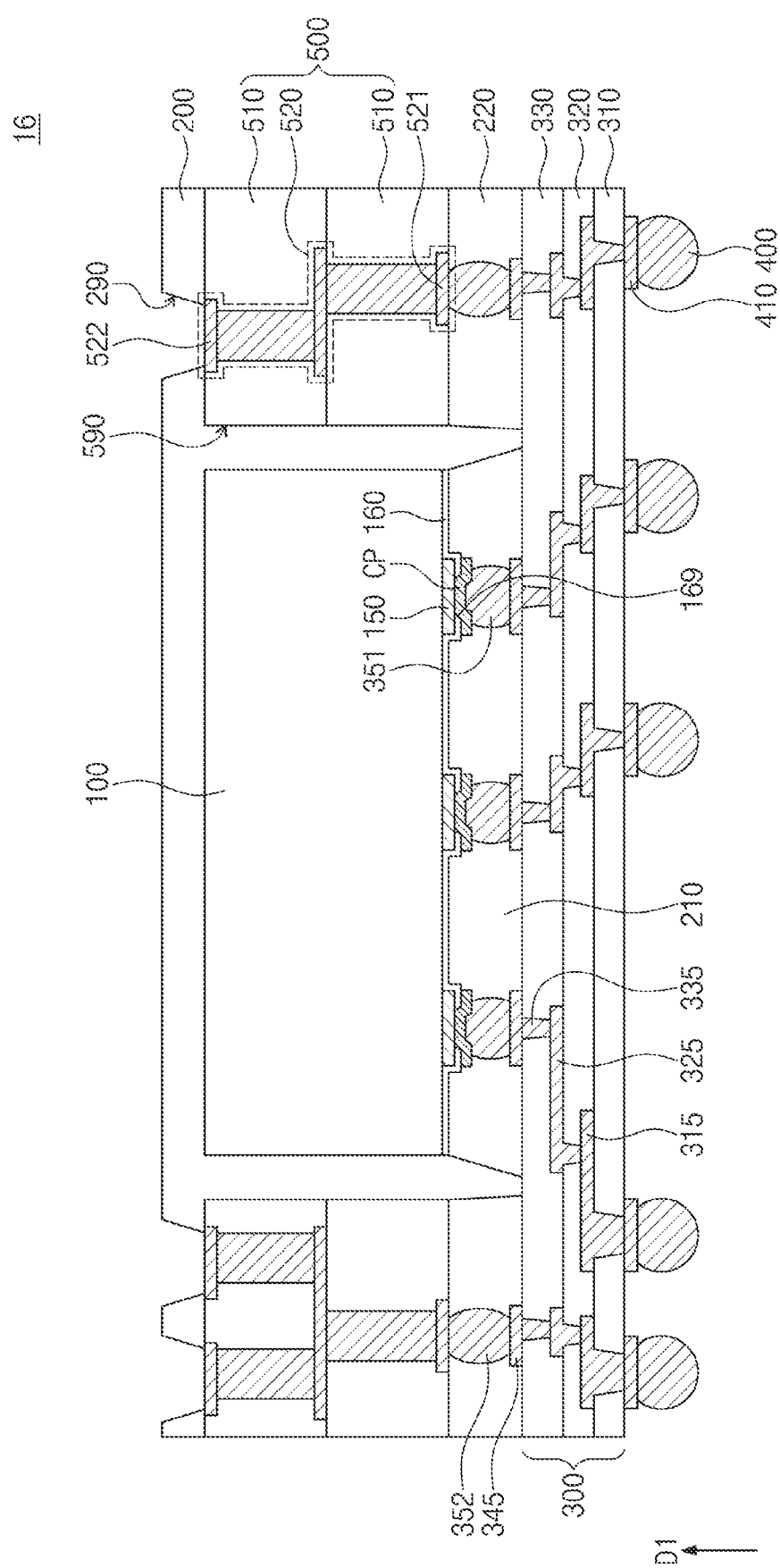

FIGS. 9E and 9F illustrate cross-sectional views taken along line I-II of FIG. 8, showing a method of fabricating a semiconductor package according to exemplary embodiments of the inventive concept. For convenience of explanation, a further description of elements and processes previously described may be omitted below.

Referring to FIG. 9E, in an exemplary embodiment, the carrier substrate 900 is prepared to include the redistribution layer 300. The carrier adhesive layer 910 is interposed between the carrier substrate 900 and the redistribution layer 300. The redistribution layer 300 may be fabricated as described with reference to FIGS. 6A and 6B. The first conductive pad 345 is provided in plural on the redistribution layer 300. The semiconductor device 100 is disposed on the redistribution layer 300 such that the capping pattern CP faces the redistribution layer 300. When viewed in a plan view, the semiconductor device 100 may be disposed on a central portion of the redistribution layer 300. The first connector 351 is formed between the capping pattern CP and one of the first conductive pads 345. The first connector 351 electrically connects the semiconductor device 100 to the redistribution patterns 315, 325, and 335. A first under-fill pattern 210 is formed in a gap between the redistribution layer 300 and the semiconductor device 100, thereby encapsulating the first connector 351.

The connection substrate 500 is disposed on the redistribution layer 300. The connection substrate 500 is described above with reference to FIGS. 8 and 9A. A second connector 352 is formed between the first pad 521 and another one of the first conductive pads 345, and is coupled to the first conductive pad 345 and the first pad 521. The conductive structure 520 is electrically connected to the redistribution patterns 315, 325, and 335 via the second connector 352. The second connector 352 may include a conductive material, and may include one or more of a solder ball, a bump, and a pillar. A second under-fill pattern 220 is formed in a gap between the redistribution layer 300 and the connection substrate 500, thereby encapsulating the second connector 352.

In an exemplary embodiment, the molding pattern 200 is formed on the semiconductor device 100 and the connection substrate 500, and fills a gap between the semiconductor device 100 and the connection substrate 500. Alternatively, in an exemplary embodiment, the first under-fill pattern 210 is not formed, and the molding pattern 200 further extends into a gap between the redistribution layer 300 and the semiconductor device 100. In an exemplary embodiment, the second under-fill pattern 220 is not formed, and the molding pattern 200 further extends into a gap between the redistribution layer 300 and the connection substrate 500. The carrier adhesive layer 910 and the carrier substrate 900 are removed to expose the bottom surface of the redistribution layer 300. Referring to FIG. 9F, the terminal pad 410 and the external terminal 400 are formed on the bottom surface of the redistribution layer 300. The terminal pad 410 is formed on the first redistribution pattern 315 exposed by the first insulation pattern 310. The external terminal 400 is electrically connected to the semiconductor device 100 or the conductive structure 520 via the redistribution patterns 315, 325, and 335. The upper hole 290 is formed in the molding pattern 200 and exposes the second pad 522 of the conductive structure 520. Through the processes described above, a semiconductor package 16 may be fabricated.

In an exemplary embodiment, the upper redistribution layer 600 illustrated in FIG. 9D is further formed on the molding pattern 200.

Figure 9G:
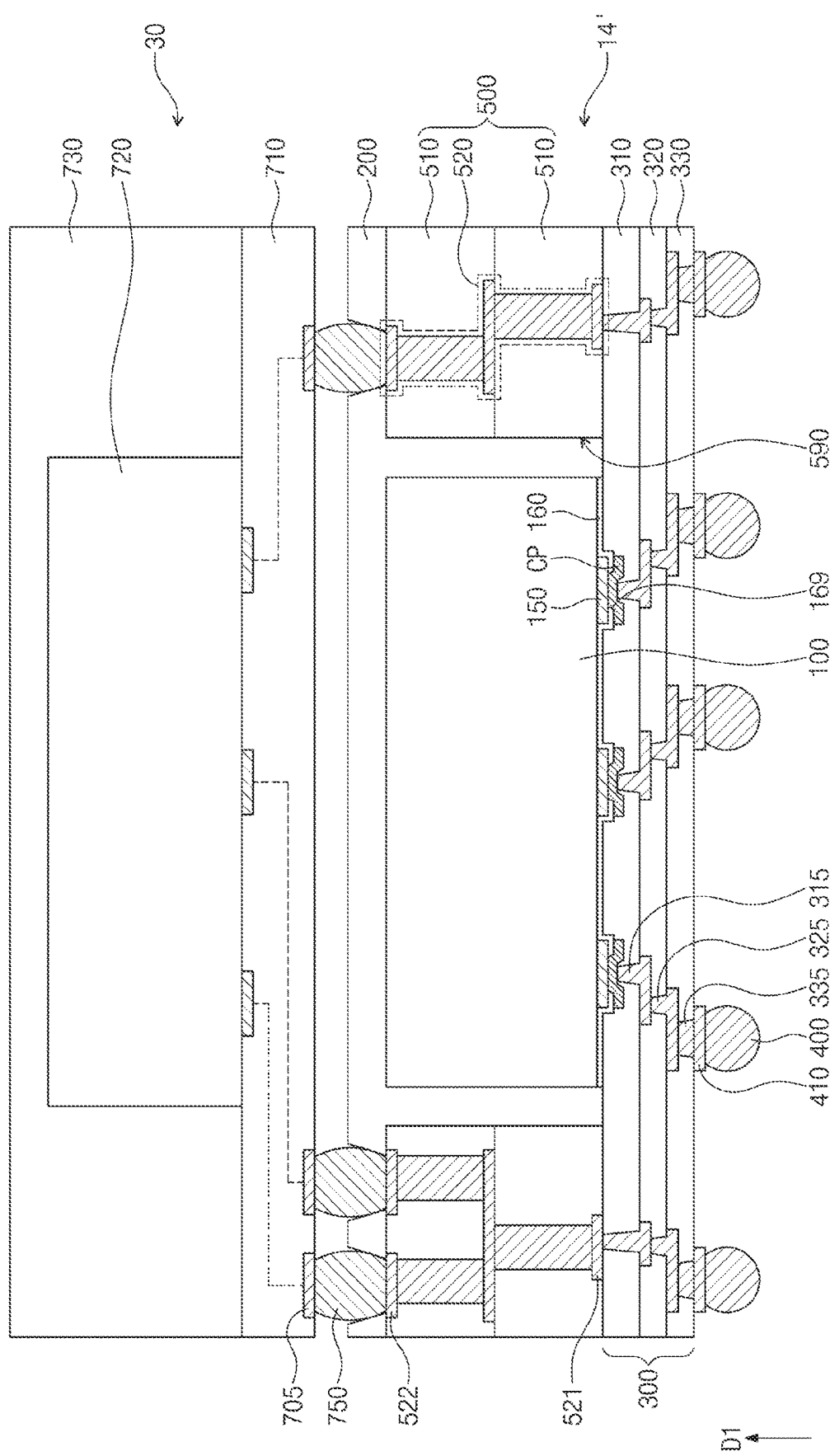
FIG. 9G illustrates a cross-sectional view showing a semiconductor package according to exemplary embodiments of the inventive concept.

FIG. 9G illustrates a cross-sectional view taken along line I-II of FIG. 8, showing a semiconductor package according to exemplary embodiments of the inventive concept. For convenience of explanation, a further description of elements and processes previously described may be omitted below.

Referring to FIG. 9G, in an exemplary embodiment, a semiconductor package 17 includes a first semiconductor package 14' and a second semiconductor package 30. The first semiconductor package 14' may be fabricated as illustrated in FIGS. 9A to 9C. For example, the first semiconductor package 14' may include the redistribution layer 300, the semiconductor device 100, the connection substrate 500, and the molding pattern 200.

The second semiconductor package 30 is disposed on the first semiconductor package 14'. The second semiconductor package 30 includes a package substrate 710, an upper semiconductor chip 720, and an upper molding pattern 730. The package substrate 710 may be a printed circuit board or may include a printed circuit board. Alternatively, the redistribution layer 300 fabricated as illustrated in FIGS. 3B to 3D or FIG. 6A may be used as the package substrate 710. A metal pad 705 is disposed on a bottom surface of the package substrate 710. The upper semiconductor chip 720 is disposed on the package substrate 710. The upper semiconductor chip 720 may include, for example, a memory circuit, a logic circuit, or any combination thereof. The upper semiconductor chip 720 may be electrically connected through the package substrate 710 to the metal pad 705, as indicated by the dotted lines in FIG. 9G. For example, in FIG. 9G, a dotted line schematically indicates an internal conductive line within the package substrate 710. The upper molding pattern 730 is disposed on the package substrate 710 and covers the upper semiconductor chip 720. The upper molding pattern 730 may include an insulating polymer such as, for example, an epoxy-based polymer.

The second pad 522 and the metal pad 705 are electrically connected to each other through a connection terminal 750 interposed therebetween. The connection terminal 750 may be, for example, a solder ball, bump, or pillar. In such a configuration, the second semiconductor package 30 is electrically connected to the semiconductor device 100 and the external terminal 400 via the connection terminal 750. In exemplary embodiments, since the connection substrate 500 is provided, the connection terminal 750 may be freely arranged. For example, in exemplary embodiments, the number and arrangement of the connection terminal 750 is not restricted by those of the first pad 521. As a result, integrated circuits may be freely arranged in the package substrate 710.

In another exemplary embodiment, the semiconductor package 15 described with reference to FIG. 9D may be used as the first semiconductor package 14'. In this case, the connection terminal 750 is disposed between the second conductive pad 650 (see FIG. 9D) and the metal pad 705. Since the upper redistribution layer 600 is provided, the connection terminal 750 may be freely arranged. For example, the connection terminal 750 may be provided in plural, and when viewed in a plan view, at least one of the plurality of connection terminals 750 may overlap the semiconductor device 100. In another exemplary embodiment, the semiconductor package 16 fabricated as illustrated in FIGS. 9E and 9F may be used as the first semiconductor package 14'.

Figure 10A:
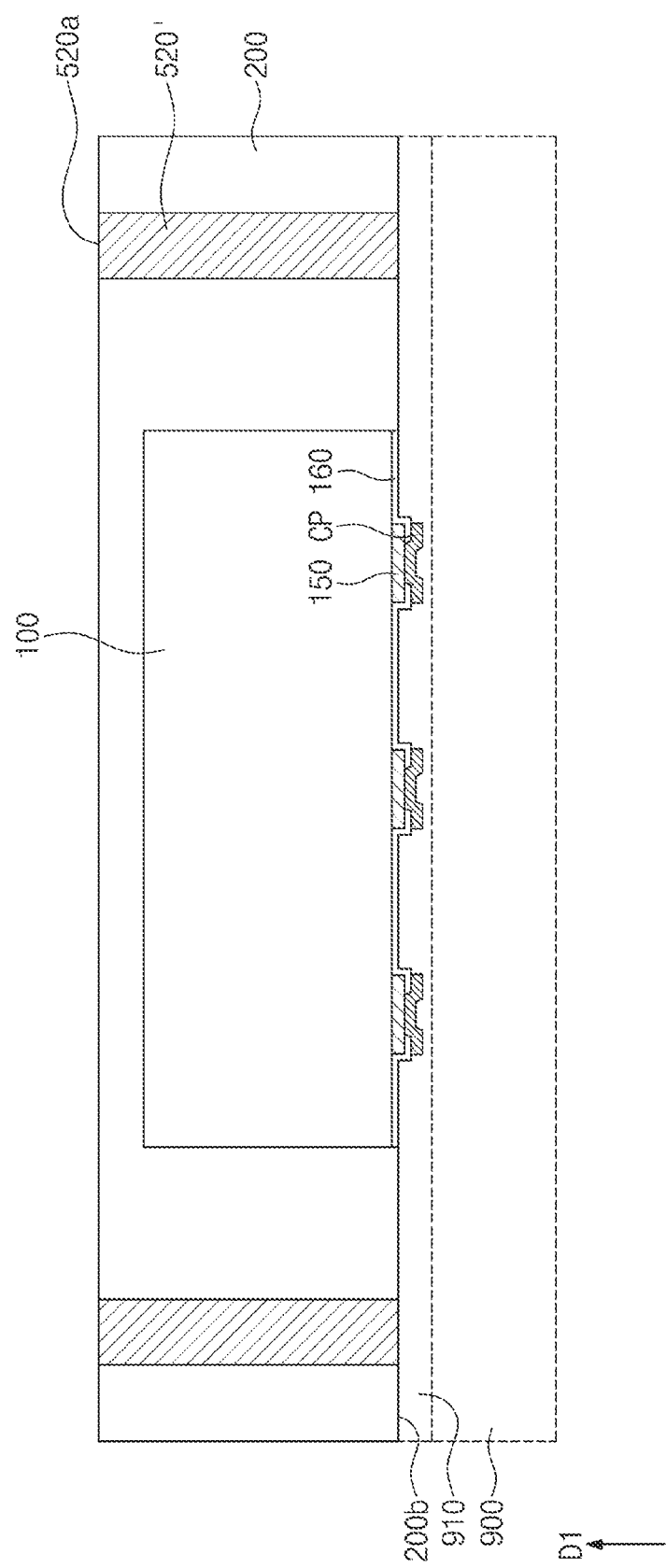
FIGS. 10A and 10B illustrate cross-sectional views showing a method of fabricating a semiconductor package according to exemplary embodiments of the inventive concept.
Figure 10B:
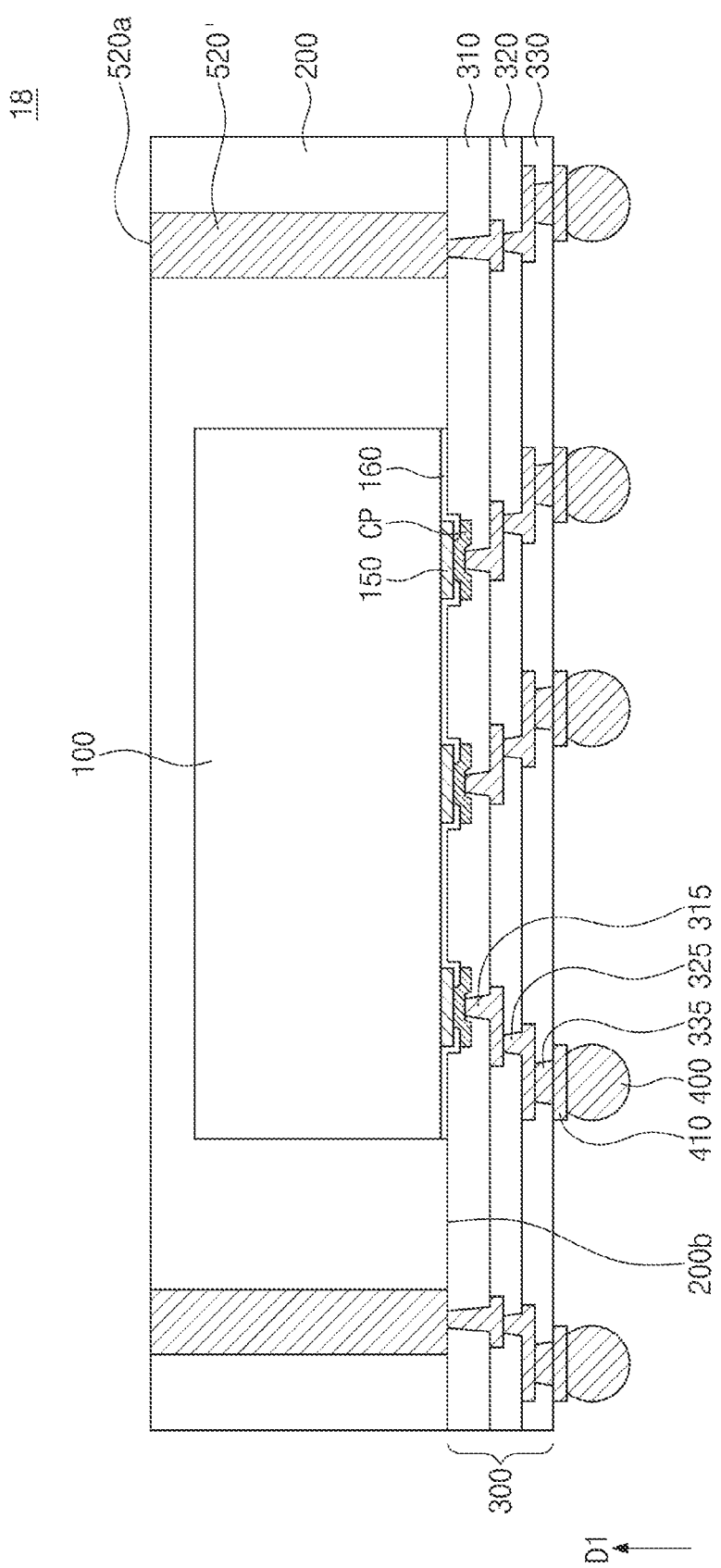

FIGS. 10A and 10B illustrate cross-sectional views showing a method of fabricating a semiconductor package according to exemplary embodiments of the inventive concept. For convenience of explanation, a further description of elements and processes previously described may be omitted below.

Referring to FIG. 10A, in an exemplary embodiment, the semiconductor device 100 is disposed on the carrier substrate 900. The capping pattern CP faces the carrier substrate 900. The carrier adhesive layer 910 is disposed between the carrier substrate 900 and the semiconductor device 100. In the exemplary embodiment illustrated in FIG. 10A, the connection substrate 500 of FIG. 9A is not provided, and instead of the connection substrate 500, a metal pillar is disposed on the carrier substrate 900 to form a conductive structure 520'. For example, the conductive structure 520' may include the metal pillar. The conductive structure 520' is spaced apart from the semiconductor device 100. The molding pattern 200 is formed on the carrier substrate 900 and covers the semiconductor device 100. The molding pattern 200 encapsulates a sidewall of the conductive structure 520' and fills a gap between the conductive structure 520' and the semiconductor device 100, and exposes a top surface 520a of the conductive structure 520'. For example, in an exemplary embodiment, the molding pattern 200 covers an entirety of the sidewall of the conductive structure 520', fills an entirety of the gap between the conductive structure 520' and the semiconductor device 100, and exposes the top surface 520a of the conductive structure 520'.

The carrier adhesive layer 910 and the carrier substrate 900 are removed to expose the capping pattern CP, the passivation pattern 160, the bottom surface 200b of the molding pattern 200, and a bottom surface of the conductive structure 520'.

Referring to FIG. 10B, in an exemplary embodiment, the first insulation pattern 310, the first redistribution pattern 315, the second insulation pattern 320, the second redistribution pattern 325, the third insulation pattern 330, and the third redistribution pattern 335 are formed on the capping pattern CP, the passivation pattern 160, the bottom surface 200b of the molding pattern 200, and the bottom surface of the conductive structure 520' to form the redistribution layer 300. The redistribution layer 300 may be formed by substantially the same processes as those discussed above with reference to FIGS. 3B to 3D. In an exemplary embodiment, the first insulation pattern 310 is in direct contact with the capping pattern CP, the passivation pattern 160, the bottom surface 200b of the molding pattern 200, and the bottom surface of the conductive structure 520'. The first redistribution pattern 315 may be provided in plural. One of the plurality of first redistribution patterns 315 is coupled to the capping pattern CP, and another one of the plurality of first redistribution patterns 315 is coupled to the conductive structure 520'. The semiconductor device 100 is electrically connected to the conductive structure 520' via the redistribution patterns 315, 325, and 335.

A plurality of terminal pads 410 and a plurality of external terminals 400 are provided on the bottom surface of the redistribution layer 300 and electrically connected to the redistribution patterns 315, 325, and 335. For example, one of the plurality of external terminals 400 is electrically connected to the semiconductor device 100 via the redistribution patterns 315, 325, and 335, and another one of the plurality of external terminals 400 is electrically connected to the conductive structure 520' via the redistribution patterns 315, 325, and 335. Through the processes described above, a semiconductor package 18 may be fabricated.

Figure 10C:
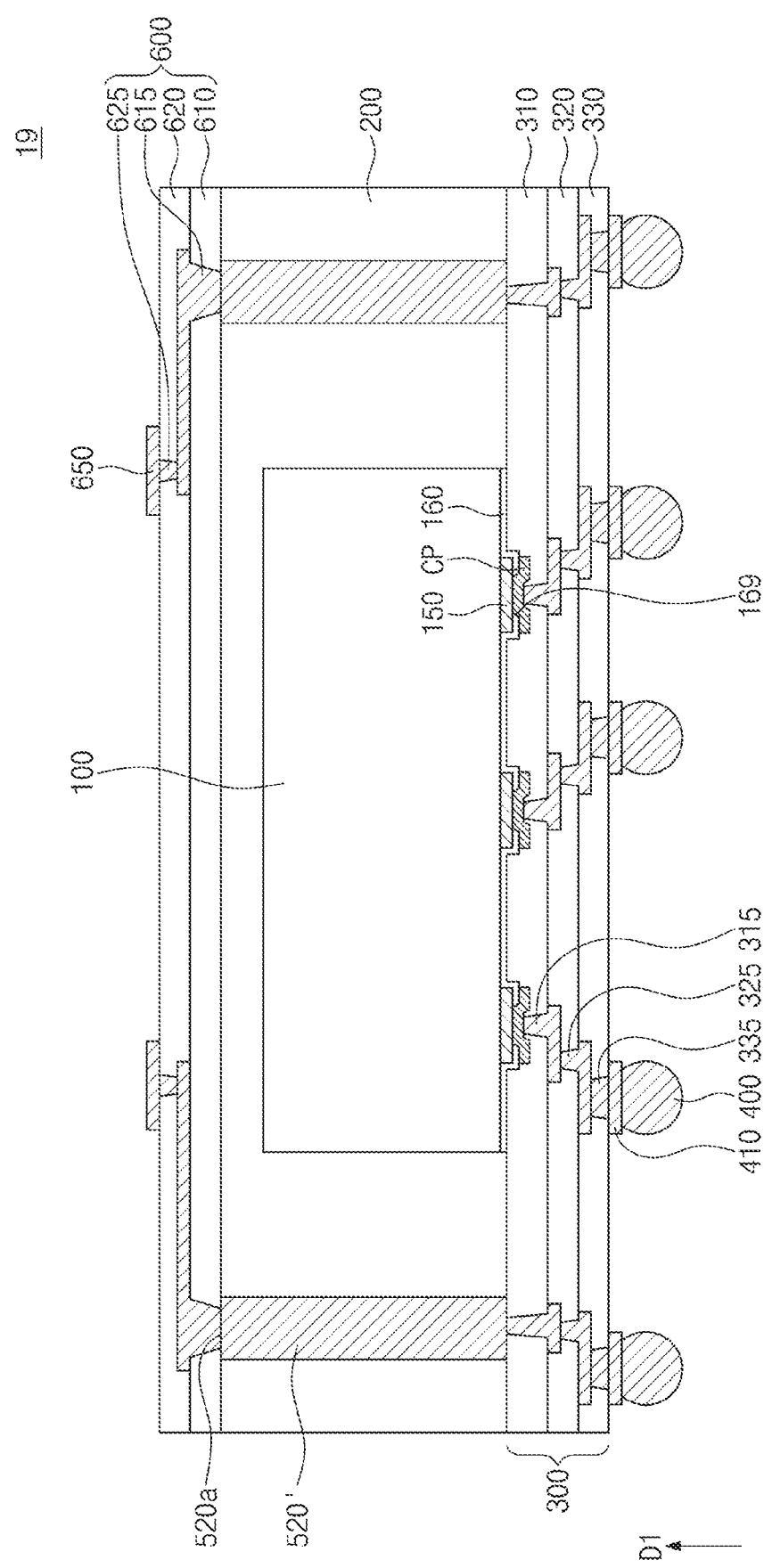
FIG. 10C illustrates a cross-sectional view showing a semiconductor package according to exemplary embodiments of the inventive concept.

FIG. 10C illustrates a cross-sectional view showing a semiconductor package according to exemplary embodiments of the inventive concept. For convenience of explanation, a further description of elements and processes previously described may be omitted below.

Referring to FIG. 10C, in an exemplary embodiment, a semiconductor package 19 includes the upper redistribution layer 600 in addition to the redistribution layer 300, the semiconductor device 100, the molding pattern 200, and the conductive structure 520'. The redistribution layer 300, the semiconductor device 100, the molding pattern 200, and the conductive structure 520' may be formed by the processes described above with reference to FIGS. 10A and 10B.

The first upper insulation pattern 610, the second upper insulation pattern 620, the first upper redistribution pattern 615, and the second upper redistribution pattern 625 are formed on the molding pattern 200 to form the upper redistribution layer 600. The formation of the first upper insulation pattern 610, the second upper insulation pattern 620, the first upper redistribution pattern 615, and the second upper redistribution pattern 625 may be substantially the same as that described above with reference to FIG. 9D. The upper redistribution patterns 615 and 625 are coupled to the conductive structure 520'. The second conductive pad 650 is disposed on the upper redistribution layer 600. The second conductive pad 650 is coupled to the conductive structure 520' via the upper redistribution patterns 615 and 625.

Figure 10D:
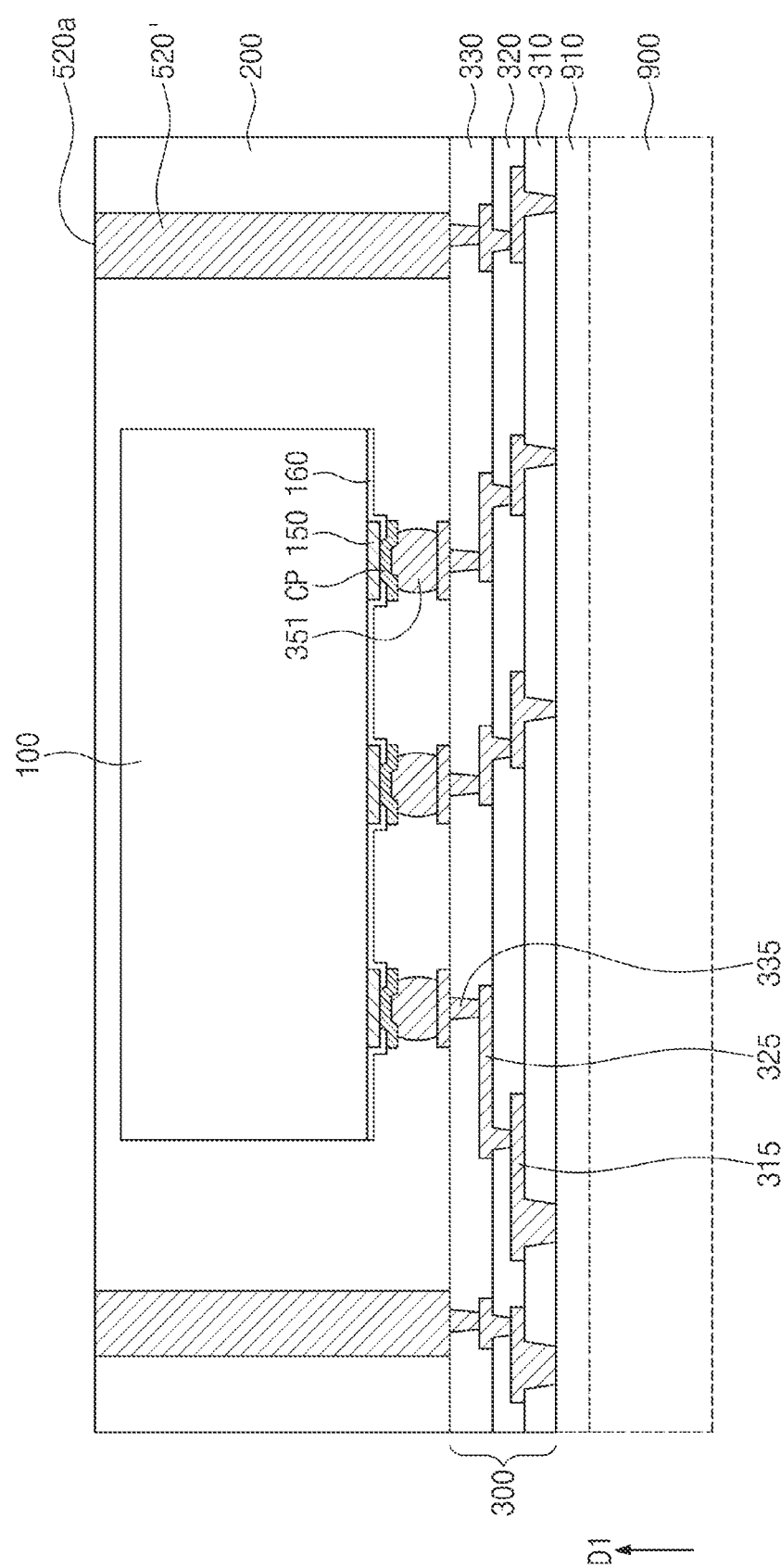
FIGS. 10D and 10E illustrate cross-sectional views showing a method of fabricating a semiconductor package according to exemplary embodiments of the inventive concept.
Figure 10E:
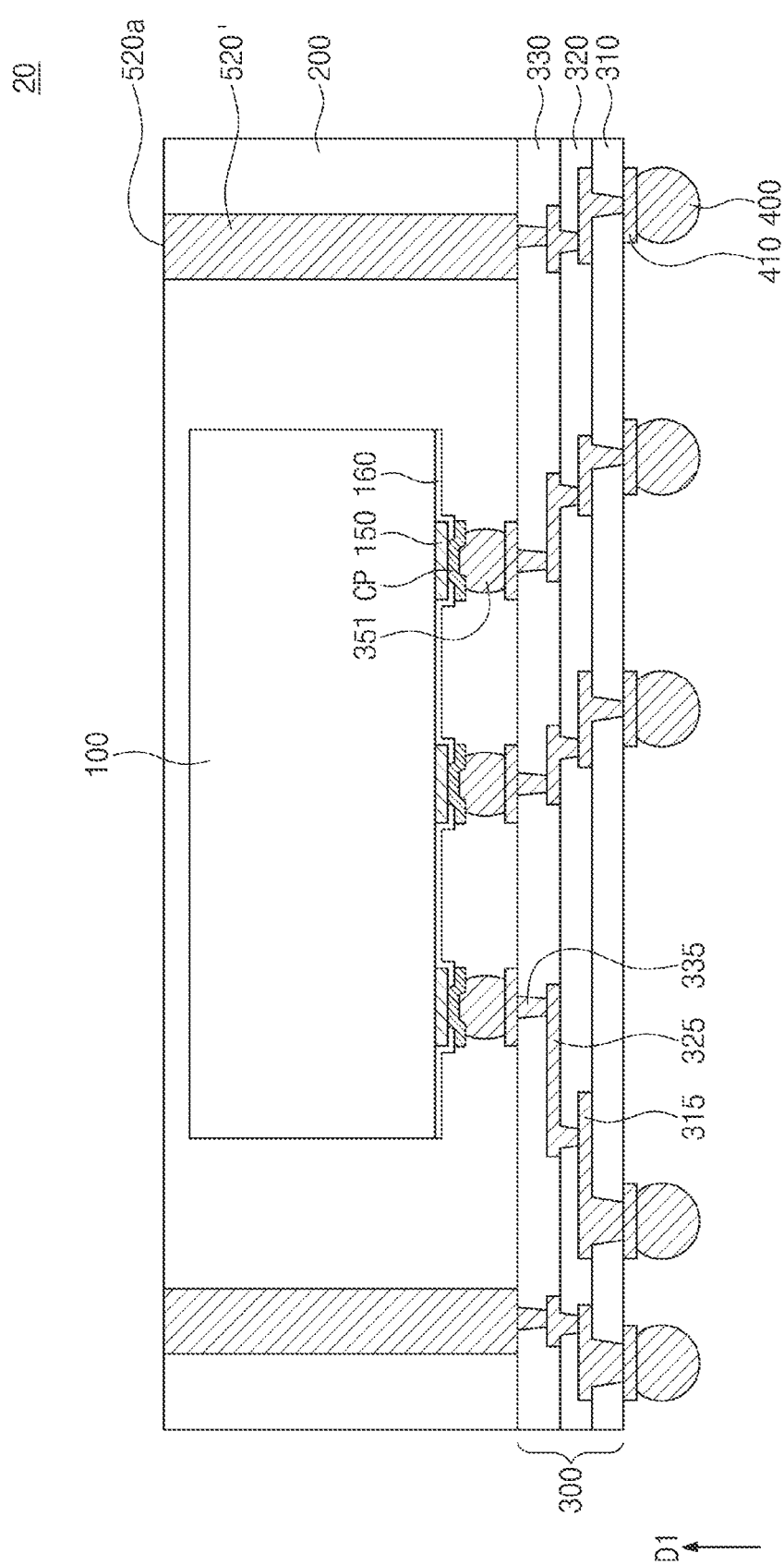

FIGS. 10D and 10E illustrate cross-sectional views showing a method of fabricating a semiconductor package according to exemplary embodiments of the inventive concept. For convenience of explanation, a further description of elements and processes previously described may be omitted below.

Referring to FIG. 10D, in an exemplary embodiment, the carrier substrate 900 is prepared to include the redistribution layer 300. The redistribution layer 300 may be formed as illustrated in FIG. 6A. The carrier adhesive layer 910 is disposed between the carrier substrate 900 and the semiconductor device 100.

The semiconductor device 100 is disposed on the redistribution layer 300 such that the capping pattern CP faces the redistribution layer 300. The first connector 351 is formed between the capping pattern CP and one of the first conductive pads 345. The first connector 351 electrically connects the semiconductor device 100 to the redistribution patterns 315, 325, and 335. A first under-fill pattern may further be formed in a gap between the redistribution layer 300 and the semiconductor device 100.

A metal pillar is disposed on the redistribution layer 300 to form the conductive structure 520'. The conductive structure 520' is electrically connected to the redistribution patterns 315, 325, and 335.

The molding pattern 200 is formed on the redistribution layer 300 and covers the semiconductor device 100. The molding pattern 200 covers a sidewall of the conductive structure 520', and exposes the top surface 520a of the conductive structure 520'. The carrier adhesive layer 910 and the carrier substrate 900 are removed to expose the bottom surface of the redistribution layer 300.

Referring to FIG. 10E, in an exemplary embodiment, a plurality of terminal pads 410 and a plurality of external terminals 400 are disposed on the bottom surface of the redistribution layer 300, and electrically connected to the redistribution patterns 315, 325, and 335. For example, the external terminals 400 are electrically connected to the semiconductor device 100 or the conductive structure 520' via the redistribution patterns 315, 325, and 335. Through the processes described above, a semiconductor package 20 may be fabricated.

Figure 10F:
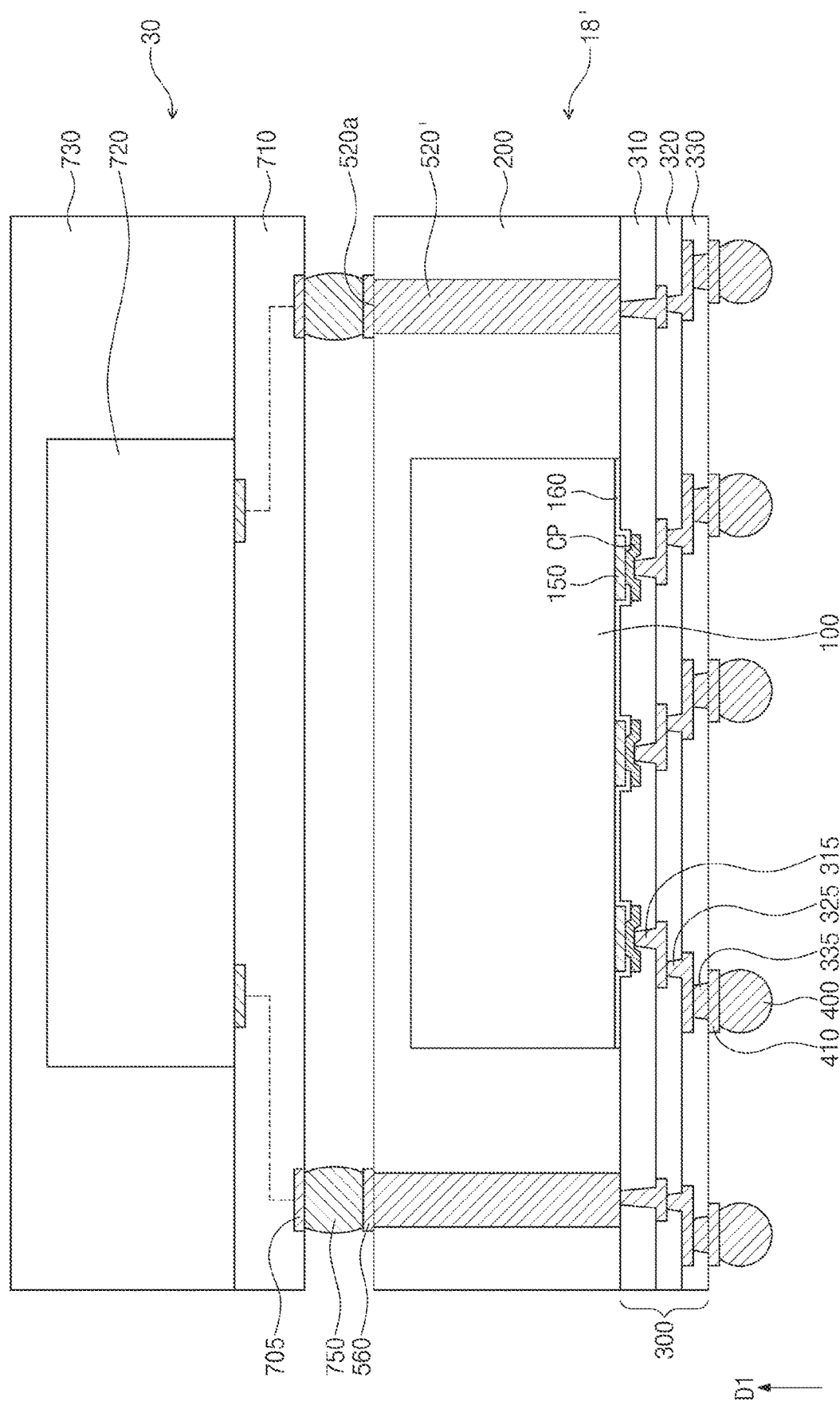
FIG. 10F illustrates a cross-sectional view showing a semiconductor package according to exemplary embodiments of the inventive concept.

FIG. 10F illustrates a cross-sectional view showing a semiconductor package according to exemplary embodiments of the inventive concept. For convenience of explanation, a further description of elements and processes previously described may be omitted below.

Referring to FIG. 10F, in an exemplary embodiment, a semiconductor package 21 includes a first semiconductor package 18' and a second semiconductor package 30. The first semiconductor package 18' may be fabricated as illustrated in FIGS. 10A and 10B. For example, the first semiconductor package 18' may include the redistribution layer 300, the semiconductor device 100, the molding pattern 200, and the conductive structure 520'.

The second semiconductor package 30 is disposed on the first semiconductor package 18'. The second semiconductor package 30 may be substantially the same as the second semiconductor package 30 of FIG. 9G. For example, the second semiconductor package 30 may include the package substrate 710, the upper semiconductor chip 720, and the upper molding pattern 730.

The conductive structure 520' and the metal pad 705 are electrically connected to each other through the connection terminal 750 interposed therebetween. A third conductive pad 560 is interposed between the conductive structure 520' and the connection terminal 750. The upper semiconductor chip 720 is electrically connected to the redistribution patterns 315, 325, and 335 via the connection terminal 750.

Alternatively, in an exemplary embodiment, the semiconductor package 19 described with reference to FIG. 10C may be used as the first semiconductor package 18'. The connection terminal 750 may be formed between the upper redistribution layer 600 and the package substrate 710, and may be coupled to the second conductive pad 650 (see FIG. 10C) and the metal pad 705. Since the upper redistribution layer 600 is provided, the connection terminal 750 may be freely arranged. Alternatively, in an exemplary embodiment, the semiconductor package 20 fabricated as illustrated in FIGS. 10D and 10E may be used as the first semiconductor package 18'.

Figure 11A:
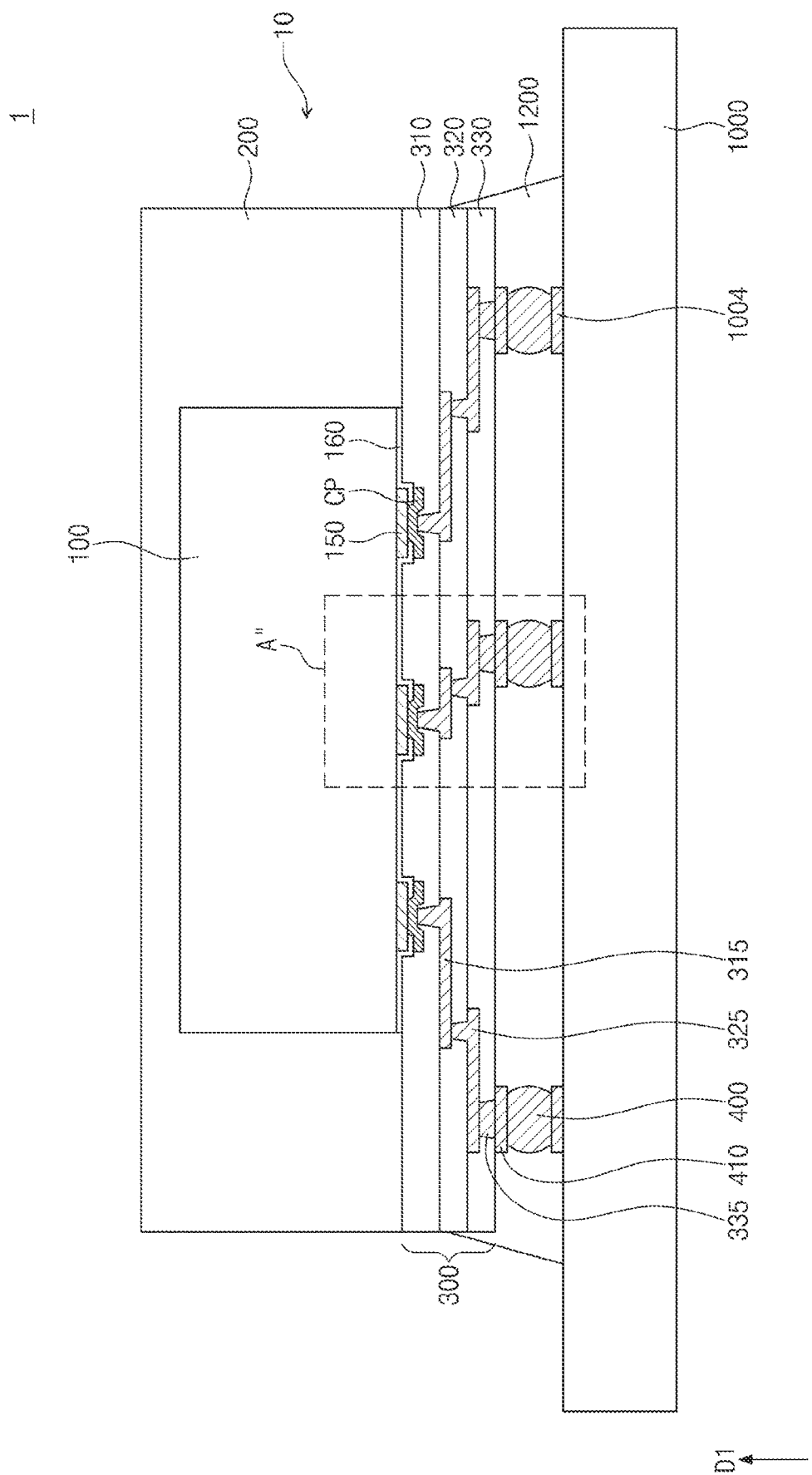
FIG. 11A illustrates a cross-sectional view showing a semiconductor module according to exemplary embodiments of the inventive concept.
Figure 11B:
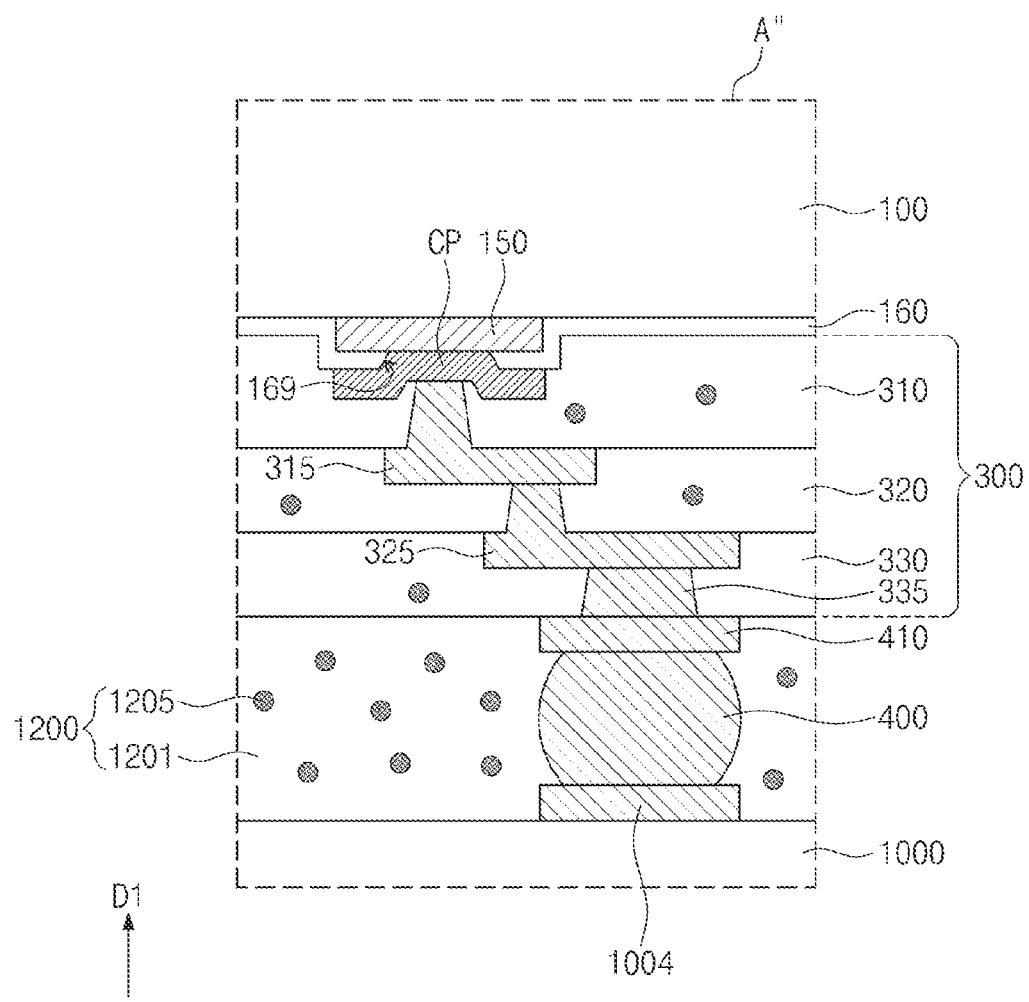
FIG. 11B illustrates an enlarged view showing section A" of FIG. 11A according to exemplary embodiments of the inventive concept.

FIG. 11A illustrates a cross-sectional view showing a semiconductor module according to exemplary embodiments of the inventive concept. FIG. 11B illustrates an enlarged view showing section A" of FIG. 11A according to exemplary embodiments of the inventive concept. For convenience of explanation, a further description of elements and processes previously described may be omitted below.

Referring to FIGS. 11A and 11B, in an exemplary embodiment, a semiconductor module 1 includes a module substrate 1000, an under-fill layer 1200, and a semiconductor package 10. The module substrate 1000 may include a printed circuit board. A module pad 1004 is disposed on a top surface of the module substrate 1000. The semiconductor package 10 may be the semiconductor package 10 fabricated as illustrated in FIGS. 3A to 3F. Alternatively, in exemplary embodiments, the module substrate 1000 may be mounted thereon with the semiconductor package 11 fabricated as shown in FIG. 5, the semiconductor package 12 fabricated as shown in FIGS. 6A to 6C, the semiconductor package 13 of FIG. 7, the semiconductor package 14 fabricated as shown in FIGS. 9A to 9C, the semiconductor package 15 of FIG. 9D, the semiconductor package 16 fabricated as shown in FIGS. 9E and 9F, the semiconductor package 17 of FIG. 9G, the semiconductor package 18 fabricated as shown in FIGS. 10A and 10B, the semiconductor package 19 of FIG. 10C, the semiconductor package 20 fabricated as shown in FIGS. 10D and 10E, or the semiconductor package 21 of FIG. 10F. Referring to FIG. 11A, the external terminal 400 is coupled to the module pad 1004. The semiconductor package 10 is electrically connected to the module substrate 1000 via the external terminal 400. The under-fill layer 1200 is interposed between the module substrate 1000 and the semiconductor package 10, thereby encapsulating the external terminal 400. In an exemplary embodiment, the under-fill layer 1200 is in physical contact with the redistribution layer 300.

Referring to FIG. 11B, in an exemplary embodiment, the under-fill layer 1200 includes an insulating polymer 1201 and reactive materials 1205. The insulating polymer 1201 may include, for example, an epoxy-based polymer. The reactive materials 1205 may be present in the insulating polymer 1201. The reactive materials 1205 may include, for example, chlorine ions. Alternatively, the reactive materials 1205 may include, for example, chemical materials or air.

Referring to a comparative example in which a semiconductor module that does not include the capping pattern CP is supplied with voltage or current, reactive materials in an under-fill layer may flow into a redistribution layer. When the reactive materials contact a chip pad, the chip pad may suffer damage (e.g., corrosion). In contrast, referring again to FIG. 11B, according to exemplary embodiments of the inventive concept, the capping pattern CP covers the portion of the chip pad 150 that is exposed through the pad opening 169. As a result, the reactive materials 1205 may be prevented from passing through the capping pattern CP, or the amount of the reactive materials 1205 that are able to pass through the capping pattern CP may be reduced. Therefore, exemplary embodiments of the inventive concept prevent or reduce damage to the chip pad 150.

According to exemplary embodiments of the inventive concept, the capping pattern CP does not react with the reactive materials 1205, or has an extremely low reactivity to the reactive materials 1205. For example, according to exemplary embodiments, reactivity between the capping pattern CP and the reactive materials 1205 is less than reactivity between the chip pad 150 and the reactive materials 1205. Thus, in exemplary embodiments, the capping pattern CP is not damaged by the reactive materials 1205. As a result, reliability and durability of the semiconductor module 1 according to exemplary embodiments of the inventive concept is improved.

According to exemplary embodiments of the inventive concept, a capping pattern covers the portion of a chip pad exposed through a pad opening. The capping pattern prevents the chip pad from contacting a redistribution layer. Thus, the chip pad may be prevented from being damaged by reactive materials, or the amount of damage to the chip pad as a result of the reactive materials may be reduced. Accordingly, a semiconductor package having improved reliability and durability is provided according to exemplary embodiments of the inventive concept.

In addition, the semiconductor package according to exemplary embodiments of the inventive concept includes the redistribution layer, resulting in a reduction in the size of the semiconductor package (e.g., the semiconductor package may become compact-sized).

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
   a redistribution layer;
   a semiconductor device disposed on the redistribution layer, wherein the semiconductor device comprises a chip pad and a passivation pattern, and the passivation pattern comprises a pad opening that exposes a portion of the chip pad;
   a capping pattern disposed in the pad opening and covering the chip pad;
   a connector including at least one of a solder ball and a bump, and disposed between the capping pattern and the redistribution layer, the connector in direct and physical contact with the capping pattern, and spaced apart from the chip pad; and
   a molding pattern disposed on the redistribution layer and covering the semiconductor device,
   wherein the redistribution layer comprises:
      an insulation pattern including a photosensitive polymer and extending onto a bottom surface of the molding pattern; and
      a redistribution pattern disposed in the insulation pattern and electrically connected to the bump,
   wherein the capping pattern is spaced apart from the insulation pattern and the redistribution pattern, and
   wherein the capping pattern comprises:
   a conductive pattern; and
   a seed layer provided between the conductive pattern and the chip pad and between the conductive pattern and the passivation pattern, the seed layer including a material different from that of the conductive pattern.

2. The semiconductor package of claim 1, wherein the seed layer comprises:
a first seed layer including a material different from that of the chip pad, and
a second layer provided between conductive pattern and the first seed layer.

3. The semiconductor package of claim 1, wherein the chip pad has a recess on a surface of the exposed portion of thereof, and
wherein the capping pattern extends into the recess of the chip pad.

4. The semiconductor package of claim 1, further comprising:
a conductive structure disposed on the redistribution layer and spaced apart from the semiconductor device,
wherein the conductive structure is electrically connected to the redistribution pattern.

5. The semiconductor package of claim 4, further comprising:
an upper redistribution layer disposed on a top surface of the molding pattern and a top surface the conductive structure,
wherein the upper redistribution layer is electrically connected to the conductive structure.

6. The semiconductor package of claim 1, wherein the capping pattern fills the pad opening and completely covers the exposed portion of the chip pad exposed through the pad opening.

7. The semiconductor package of claim 1, further comprising:
a connection substrate disposed on the redistribution layer and comprising a hole that penetrates the connection substrate,
wherein the semiconductor device is disposed in the hole of the connection substrate.

8. A semiconductor package, comprising:
a redistribution layer;
a semiconductor device disposed on the redistribution layer, wherein the semiconductor device comprises a chip pad and a passivation pattern, and the passivation pattern comprises a pad opening that exposes a portion of the chip pad;
a capping pattern disposed in the pad opening and covering the chip pad; and
a connector disposed between the redistribution layer and the capping pattern, and coupled to the capping pattern,
wherein the connector is in a physical contact with the capping pattern, and includes at least one of a solder ball and a bump.

9. The semiconductor package of claim 8, further comprising an under-fill pattern provided in a gap between the redistribution layer and the semiconductor device,
wherein the under-fill pattern encapsulates the connector and the capping pattern.

10. The semiconductor package of claim 8, further comprising:
a conductive structure disposed on the redistribution layer and spaced apart from the semiconductor device,
wherein the conductive structure is electrically connected to the redistribution layer.

11. The semiconductor package of claim 10, further comprising:
an upper redistribution layer disposed on top surfaces of the plurality of conductive structure and electrically connected to the plurality of conductive structure.

12. The semiconductor package of claim 11, further comprising:
a molding pattern disposed between the redistribution layer and the upper redistribution layer and covering the semiconductor device and sidewalls of the plurality of conductive structure.

13. The semiconductor package of claim 8, wherein the capping pattern comprises:
a seed layer provided on a bottom surface of the exposed portion of the chip pad and a bottom surface of the passivation pattern; and
a conductive pattern disposed on a lower surface of the seed layer,
wherein the lower surface of the seed layer comprises:
a first lower surface disposed on the bottom surface of the exposed portion of the chip pad; and
a second lower surface disposed on the bottom surface of the passivation pattern, and
wherein the second lower surface of the seed layer is disposed at a lower level that the first lower surface.

14. The semiconductor package of claim 8, further comprising:
a molding pattern covering the semiconductor device
wherein the redistribution layer extends onto a lower surface of the molding pattern.

15. The semiconductor package of claim 8, wherein the redistribution layer comprises:
a plurality of stacked insulation patterns; and
a redistribution pattern electrically connected to the connector,
wherein the insulation patterns comprise a photosensitive polymer.

16. A semiconductor package, comprising:
a redistribution layer including an insulation pattern and a redistribution pattern in the insulation pattern;
a semiconductor device disposed on the redistribution layer, wherein the semiconductor device comprises a chip pad and a passivation pattern, and the passivation pattern comprises a pad opening that exposes a portion of the chip pad; and
a capping pattern disposed in the pad opening and covering the chip pad,
wherein the redistribution pattern is spaced apart from the chip pad and is electrically connected to the chip pad through the capping pattern,
wherein the capping pattern comprises:
a seed layer provided on a bottom surface of the exposed portion of the chip pad and a bottom surface of the passivation pattern;
a conductive pattern disposed on a lower surface of the seed layer,
wherein the lower surface of the seed layer comprises:
a first lower surface disposed on the bottom surface of the exposed portion of the chip pad; and
a second lower surface disposed on the bottom surface of the passivation pattern, and
wherein the second lower surface of the seed layer is disposed at a lower level that the first lower surface.

17. The semiconductor package of claim 16, wherein the chip pad has a recess on a bottom surface of the exposed portion of thereof, and
wherein the capping pattern extends into the recess of the chip pad.

18. The semiconductor package of claim 16, wherein the insulation pattern includes a photosensitive polymer and is spaced apart from the capping pattern.

19. The semiconductor package of claim 16, further comprising:
- a molding pattern covering a side-surface and an upper surface of the semiconductor device,
- wherein the redistribution layer extends onto a lower surface of the molding pattern.

20. The semiconductor package of claim 16, further comprising:
- a connector between the capping pattern and the redistribution pattern and including at least one of a solder ball and a bump,
- wherein the connector is spaced apart and is physically separated from the chip pad, and is in direct and physical contact with the capping pattern.

* * * * *